US012234729B2

(12) United States Patent
Jin et al.

(10) Patent No.: US 12,234,729 B2
(45) Date of Patent: Feb. 25, 2025

(54) MULTIWELL PAD DRILLING FRAMEWORK

(71) Applicant: Schlumberger Technology Corporation, Sugar Land, TX (US)

(72) Inventors: Peng Jin, Beijing (CN); Qing Liu, Beijing (CN); Lu Jiang, Beijing (CN); Wanning Liu, Beijing (CN); XiaoWei Sheng, Beijing (CN); Zhenyu Chen, Beijing (CN); Hai Feng Li, Beijing (CN)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 18/183,330

(22) Filed: Mar. 14, 2023

(65) Prior Publication Data

US 2023/0306168 A1    Sep. 28, 2023

Related U.S. Application Data

(60) Provisional application No. 63/269,274, filed on Mar. 14, 2022.

(51) Int. Cl.
*E21B 7/04* (2006.01)
*E21B 44/00* (2006.01)

(52) U.S. Cl.
CPC .............. *E21B 7/04* (2013.01); *E21B 44/00* (2013.01); *E21B 2200/20* (2020.05)

(58) Field of Classification Search
CPC ......... E21B 44/00; E21B 41/0092; E21B 7/04
See application file for complete search history.

(56) References Cited

U.S. PATENT DOCUMENTS

| | | | |
|---|---|---|---|
| 6,757,613 B2 * | 6/2004 | Chapman | E21B 7/04 |
| | | | 702/6 |
| 2009/0056935 A1 | 3/2009 | Prange et al. | |
| 2009/0200014 A1 * | 8/2009 | Schottle | E21B 7/06 |
| | | | 166/245 |
| 2011/0172976 A1 | 7/2011 | Budiman et al. | |
| (Continued) | | | |

FOREIGN PATENT DOCUMENTS

| | | |
|---|---|---|
| WO | 2016172006 | 10/2016 |
| WO | 2018035661 | 3/2018 |

OTHER PUBLICATIONS

Search Report and Written Opinion of International Patent Application No. PCT/US2023/064283 dated Jun. 29, 2023, 8 pages.

*Primary Examiner* — Lam S Nguyen
(74) *Attorney, Agent, or Firm* — Jeffrey D. Frantz

(57) ABSTRACT

A method can include receiving input for a multiwell pad; selecting, based at least in part on a portion of the input, a template for the multiwell pad; generating, based at least in part on the template, well trajectories for the multiwell pad, where each of the well trajectories extends from a surface location of the multiwell pad to one or more reservoir target locations and where each of the well trajectories includes at least one curve generated using one or more dogleg severity values and one or more geometric control points that are not required to lie on one or more of the well trajectories; and outputting specifications for the generated trajectories of the multiwell pad.

20 Claims, 16 Drawing Sheets

(56) References Cited

U.S. PATENT DOCUMENTS

| | | | |
|---|---|---|---|
| 2013/0140037 A1* | 6/2013 | Sequeira, Jr. | E21B 7/04 |
| | | | 703/10 |
| 2013/0199784 A1* | 8/2013 | Swadi | E21B 29/06 |
| | | | 166/55.7 |
| 2013/0317798 A1 | 11/2013 | Cheng et al. | |
| 2016/0003008 A1 | 1/2016 | Uribe et al. | |
| 2018/0106133 A1* | 4/2018 | Bolchover | E21B 41/00 |
| 2020/0256181 A1 | 8/2020 | Jamieson et al. | |
| 2020/0277848 A1* | 9/2020 | Johnston | E21B 44/00 |

* cited by examiner

| Name | Min CTC | Min CTC_well | Min OSF | Min OSF_well | Nudge_incl_deg | Nudge_azi_deg | Nudge_kop_depth | Kop_depth | HKLD | STOR |
|---|---|---|---|---|---|---|---|---|---|---|
| 219H | 7.5946 | 220H | 1.8195 | 220H | 25 | 266.13 | 200 | 5536 | 2.562+6 | 67995 |
| 220H | 7.5944 | 219H | 1.8190 | 219H | 8 | 263.37 | 200 | 5469 | 2.57+6 | 51668 |
| 221H | 7.62 | 220H | 1.822 | 220H | 12 | 101.18 | 200 | 5464 | 2.566+6 | 55775 |

1300

| Slot layout | Define by well | ∧ |
| --- | --- | --- |
| Pad Center | ___ N/-S | ___ E/-W |
| Row | | . |
| Row spacing | | . |
| Column | ............................. | |
| Column spacing | ............................. | |
| Rotation | ............................. | |

| Targets | | ∧ |
| --- | --- | --- |
| Targets | ............................. | |
| | ............................. | |
| Advanced Setup | | ∨ |

[Generate Pad]

Fig. 13

MULTIWELL PAD DRILLING FRAMEWORK

RELATED APPLICATION

This application claims priority to and the benefit of a US Provisional Application having Ser. No. 63/269,274, filed 14 Mar. 2022, which is incorporated herein in its entirety.

BACKGROUND

A reservoir can be a subsurface formation that can be characterized at least in part by its porosity and fluid permeability. As an example, a reservoir may be part of a basin such as a sedimentary basin. A basin can be a depression (e.g., caused by plate tectonic activity, subsidence, etc.) in which sediments accumulate. As an example, where hydrocarbon source rocks occur in combination with appropriate depth and duration of burial, a petroleum system may develop within a basin, which may form a reservoir that includes hydrocarbon fluids (e.g., oil, gas, etc.).

In oil and gas exploration, interpretation is a process that involves analysis of data to identify and locate various subsurface structures (e.g., horizons, faults, geobodies, etc.) in a geologic environment. Various types of structures (e.g., stratigraphic formations) may be indicative of hydrocarbon traps or flow channels, as may be associated with one or more reservoirs (e.g., fluid reservoirs). In the field of resource extraction, enhancements to interpretation can allow for construction of a more accurate model of a subsurface region, which, in turn, may improve characterization of the subsurface region for purposes of resource extraction. Characterization of one or more subsurface regions in a geologic environment can guide, for example, performance of one or more operations (e.g., field operations, etc.). As an example, a plan can depend on a model of a subsurface region where the plan can specify how a drilling operation can accurately construct a borehole according to a trajectory that penetrates a reservoir, etc., where fluid may be produced via the borehole (e.g., as a completed well, etc.). As an example, one or more workflows may be performed using one or more computational frameworks, systems, etc., for one or more of analysis, acquisition, model building, control, etc., for exploration, interpretation, drilling, fracturing, production, etc.

SUMMARY

A method can include receiving input for a multiwell pad; selecting, based at least in part on a portion of the input, a template for the multiwell pad; generating, based at least in part on the template, well trajectories for the multiwell pad, where each of the well trajectories extends from a surface location of the multiwell pad to one or more reservoir target locations and where each of the well trajectories includes at least one curve generated using one or more dogleg severity values and one or more geometric control points that are not required to lie on one or more of the well trajectories; and outputting specifications for the generated trajectories of the multiwell pad. A system can include one or more processors; memory accessible to at least one of the one or more processors; processor-executable instructions stored in the memory and executable to instruct the system to: receive input for a multiwell pad; select, based at least in part on a portion of the input, a template for the multiwell pad; generate, based at least in part on the template, well trajectories for the multiwell pad, where each of the well trajectories extends from a surface location of the multiwell pad to one or more reservoir target locations and where each of the well trajectories includes at least one curve generated using one or more dogleg severity values and one or more geometric control points that are not required to lie on one or more of the well trajectories; and output specifications for the generated trajectories of the multiwell pad. One or more computer-readable storage media can include processor-executable instructions to instruct a computing system to: receive input for a multiwell pad; select, based at least in part on a portion of the input, a template for the multiwell pad; generate, based at least in part on the template, well trajectories for the multiwell pad, where each of the well trajectories extends from a surface location of the multiwell pad to one or more reservoir target locations and wherein each of the well trajectories includes at least one curve generated using one or more dogleg severity values and one or more geometric control points that are not required to lie on one or more of the well trajectories; and output specifications for the generated trajectories of the multiwell pad. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

The following detailed description refers to the accompanying drawings. Wherever convenient Features and advantages of the described implementations can be more readily understood by reference to the following description taken in conjunction with the accompanying drawings.

FIG. 13 shows an example of a graphical user interface.

DETAILED DESCRIPTION

This description is not to be taken in a limiting sense, but rather is made merely for the purpose of describing the general principles of the implementations. The scope of the described implementations should be ascertained with reference to the issued claims.

Figure 1:
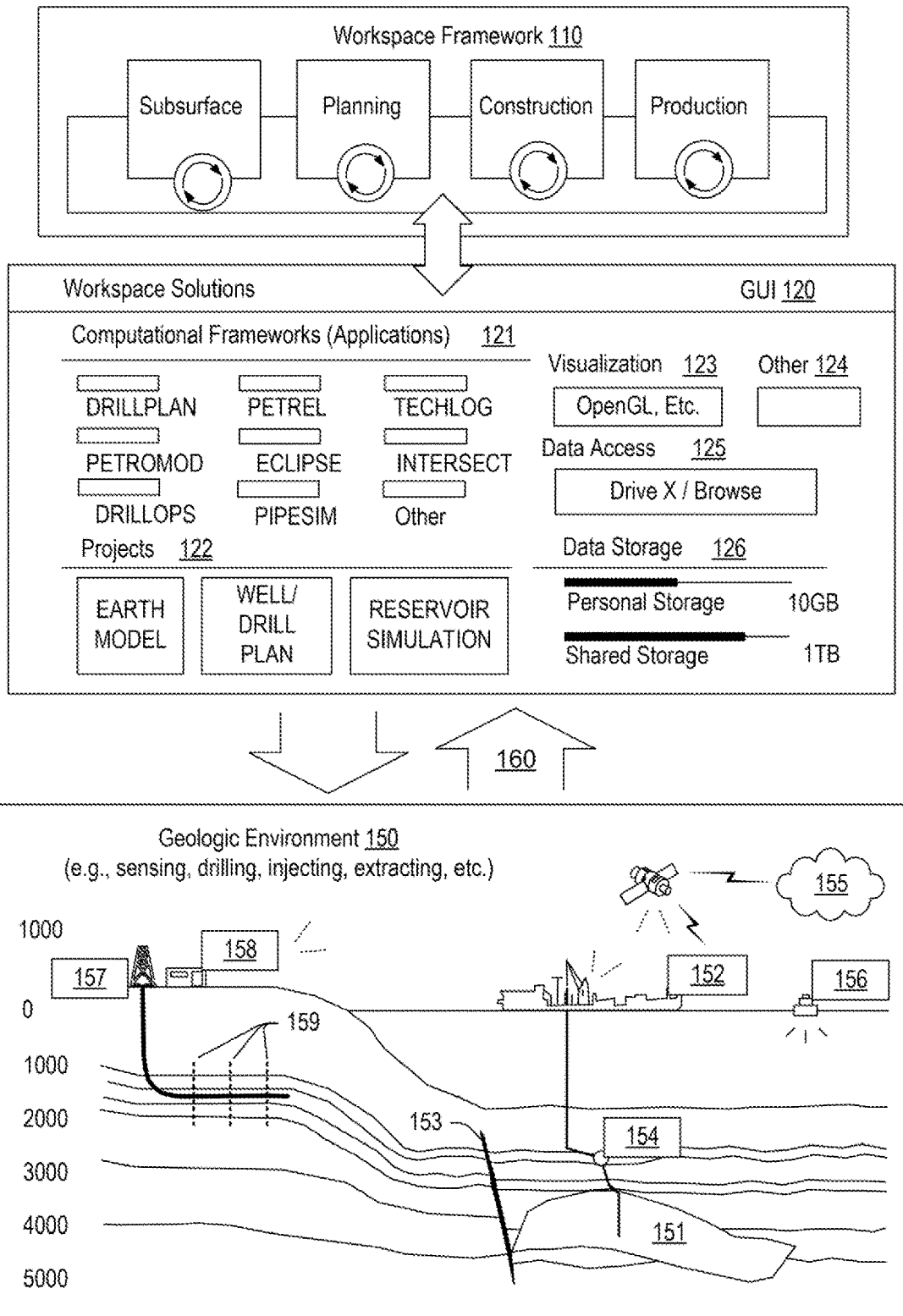
FIG. 1 shows an example of a system.

FIG. 1 shows an example of a system 100 that includes a workspace framework 110 that can provide for instantiation of, rendering of, interactions with, etc., a graphical user interface (GUI) 120. In the example of FIG. 1, the GUI 120 can include graphical controls for computational frameworks (e.g., applications, etc.) 121, projects 122, visualization 123, one or more other features 124, data access 125, and data storage 126.

In the example of FIG. 1, the workspace framework 110 may be tailored to a particular geologic environment such as an example geologic environment 150. For example, the geologic environment 150 may include layers (e.g., stratification) that include a reservoir 151 and that may be intersected by a fault 153. As an example, the geologic environment 150 may be outfitted with a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a wellsite and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

In the example of FIG. 1, the GUI 120 shows some examples of computational frameworks, including the DRILLPLAN, DRILLOPS, PETREL, TECHLOG, PETROMOD, ECLIPSE, PIPESIM, and INTERSECT frameworks (SLB, Houston, Texas).

The DRILLPLAN framework provides for digital well construction planning and includes features for automation of repetitive tasks and validation workflows, enabling improved quality drilling programs (e.g., digital drilling plans, etc.) to be produced quickly with assured coherency.

The DRILLOPS framework can execute a digital drilling plan and ensures plan adherence, while delivering goal-based automation. The DRILLOPS framework can generate activity plans automatically individual operations, whether they are monitored and/or controlled on the rig or in town. Automation can utilize data analysis and learning systems to assist and optimize tasks, such as, for example, setting ROP to drilling a stand. A preset menu of automatable drilling tasks can be rendered, and, using data analysis and models, a plan can be executed in a manner to achieve a specified goal, where, for example, measurements can be utilized for calibration. The DRILLOPS framework provides flexibility to modify and replan activities dynamically, for example, based on a live appraisal of various factors (e.g., equipment, personnel, and supplies). Well construction activities (e.g., tripping, drilling, cementing, etc.) can be continually monitored and dynamically updated using feedback from operational activities. The DRILLOPS framework can provide for various levels of automation based on planning and/or re-planning (e.g., via the DRILLPLAN framework), feedback, etc.

The PETREL framework can be part of the DELFI environment for utilization in geosciences and geoengineering, for example, to analyze subsurface data from exploration to production of fluid from a reservoir. The DELFI cognitive exploration and production (E&P) environment (SLB, Houston, Texas), referred to herein as the DELFI environment or DELFI framework, is a secure, cognitive, cloud-based collaborative environment that integrates data and workflows with digital technologies, such as artificial intelligence and machine learning.

The PETREL framework provides components that allow for optimization of various exploration, development and production operations. The PETREL framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes (e.g., with respect to one or more geologic environments, etc.). Such a framework may be considered an application (e.g., executable using one or more devices) and may be considered a data-driven application (e.g., where data is input for purposes of modeling, simulating, etc.).

The TECHLOG framework can handle and process field and laboratory data for a variety of geologic environments (e.g., deepwater exploration, shale, etc.). The TECHLOG framework can structure wellbore data for analyses, planning, etc.

The PETROMOD framework provides petroleum systems modeling capabilities that can combine one or more of seismic, well, and geological information to model the evolution of a sedimentary basin. The PETROMOD framework can predict if, and how, a reservoir has been charged with hydrocarbons, including the source and timing of hydrocarbon generation, migration routes, quantities, and hydrocarbon type in the subsurface or at surface conditions.

The ECLIPSE framework provides a reservoir simulator (e.g., as a computational framework) with numerical solutions for fast and accurate prediction of dynamic behavior for various types of reservoirs and development schemes.

The INTERSECT framework provides a high-resolution reservoir simulator for simulation of detailed geological features and quantification of uncertainties, for example, by creating accurate production scenarios and, with the integration of precise models of the surface facilities and field operations, the INTERSECT framework can produce reliable results, which may be continuously updated by real-time data exchanges (e.g., from one or more types of data acquisition equipment in the field that can acquire data during one or more types of field operations, etc.). The INTERSECT framework can provide completion configurations for complex wells where such configurations can be built in the field, can provide detailed enhanced-oil-recovery (EOR) formulations where such formulations can be implemented in the field, can analyze application of steam injection and other thermal EOR techniques for implementation in the field, advanced production controls in terms of reservoir coupling and flexible field management, and flexibility to script customized solutions for improved modeling and field management control. The INTERSECT framework, as with the other example frameworks, may be utilized as part of the DELFI environment, for example, for rapid simulation of multiple concurrent cases. For example, a workflow may utilize one or more of the DELFI environment on demand reservoir simulation features.

The aforementioned DELFI environment provides various features for workflows as to subsurface analysis, planning, construction and production, for example, as illustrated in the workspace framework 110. As shown in FIG. 1, outputs from the workspace framework 110 can be utilized for directing, controlling, etc., one or more processes in the geologic environment 150 and, feedback 160, can be received via one or more interfaces in one or more forms (e.g., acquired data as to operational conditions, equipment conditions, environment conditions, etc.).

As an example, a workflow may progress to a geology and geophysics ("G&G") service provider, which may generate a well trajectory, which may involve execution of one or more G&G frameworks (e.g., consider the PETREL framework, etc.).

In the example of FIG. 1, the visualization features 123 may be implemented via the workspace framework 110, for example, to perform tasks as associated with one or more of subsurface regions, planning operations, constructing wells and/or surface fluid networks, and producing from a reservoir.

As an example, a visualization process can implement one or more of various features that can be suitable for one or more web applications. For example, a template may involve use of the JAVASCRIPT object notation format (JSON) and/or one or more other languages/formats. As an example, a framework may include one or more converters. For example, consider a JSON to PYTHON converter and/or a PYTHON to JSON converter. Such an approach can provide for compatibility of devices, frameworks, etc., with respect to one or more sets of instructions.

As an example, visualization features can provide for visualization of various earth models, properties, etc., in one or more dimensions. As an example, visualization features can provide for rendering of information in multiple dimensions, which may optionally include multiple resolution rendering. In such an example, information being rendered may be associated with one or more frameworks and/or one or more data stores. As an example, visualization features may include one or more control features for control of equipment, which can include, for example, field equipment that can perform one or more field operations. As an example, a workflow may utilize one or more frameworks to generate information that can be utilized to control one or more types of field equipment (e.g., drilling equipment, wireline equipment, fracturing equipment, etc.).

As to a reservoir model that may be suitable for utilization by a simulator, consider acquisition of seismic data as acquired via reflection seismology, which finds use in geophysics, for example, to estimate properties of subsurface formations. As an example, reflection seismology may provide seismic data representing waves of elastic energy (e.g., as transmitted by P-waves and S-waves, in a frequency range of approximately 1 Hz to approximately 100 Hz). Seismic data may be processed and interpreted, for example, to understand better composition, fluid content, extent and geometry of subsurface rocks. Such interpretation results can be utilized to plan, simulate, perform, etc., one or more operations for production of fluid from a reservoir (e.g., reservoir rock, etc.).

Field acquisition equipment may be utilized to acquire seismic data, which may be in the form of traces where a trace can include values organized with respect to time and/or depth (e.g., consider 1 D, 2D, 3D or 4D seismic data). For example, consider acquisition equipment that acquires digital samples at a rate of one sample per approximately 4 ms. Given a speed of sound in a medium or media, a sample rate may be converted to an approximate distance. For example, the speed of sound in rock may be on the order of around 5 km per second. Thus, a sample time spacing of approximately 4 ms would correspond to a sample "depth" spacing of about 10 meters (e.g., assuming a path length from source to boundary and boundary to sensor). As an example, a trace may be about 4 seconds in duration; thus, for a sampling rate of one sample at about 4 ms intervals, such a trace would include about 1000 samples where latter acquired samples correspond to deeper reflection boundaries. If the 4 second trace duration of the foregoing example is divided by two (e.g., to account for reflection), for a vertically aligned source and sensor, a deepest boundary depth may be estimated to be about 10 km (e.g., assuming a speed of sound of about 5 km per second).

As an example, a model may be a simulated version of a geologic environment. As an example, a simulator may include features for simulating physical phenomena in a geologic environment based at least in part on a model or models. A simulator, such as a reservoir simulator, can simulate fluid flow in a geologic environment based at least in part on a model that can be generated via a framework that receives seismic data. A simulator can be a computerized system (e.g., a computing system) that can execute instructions using one or more processors to solve a system of equations that describe physical phenomena subject to various constraints. In such an example, the system of equations may be spatially defined (e.g., numerically discretized) according to a spatial model that that includes layers of rock, geobodies, etc., that have corresponding positions that can be based on interpretation of seismic and/or other data. A spatial model may be a cell-based model where cells are defined by a grid (e.g., a mesh). A cell in a cell-based model can represent a physical area or volume in a geologic environment where the cell can be assigned physical properties (e.g., permeability, fluid properties, etc.) that may be germane to one or more physical phenomena (e.g., fluid volume, fluid flow, pressure, etc.). A reservoir simulation model can be a spatial model that may be cell-based.

A simulator can be utilized to simulate the exploitation of a real reservoir, for example, to examine different productions scenarios to find an optimal one before production or further production occurs. A reservoir simulator does not provide an exact replica of flow in and production from a reservoir at least in part because the description of the reservoir and the boundary conditions for the equations for flow in a porous rock are generally known with an amount of uncertainty. Certain types of physical phenomena occur at a spatial scale that can be relatively small compared to size of a field. A balance can be struck between model scale and computational resources that results in model cell sizes being of the order of meters; rather than a lesser size (e.g., a level of detail of pores). A modeling and simulation workflow for multiphase flow in porous media (e.g., reservoir rock, etc.) can include generalizing real micro-scale data from macro scale observations (e.g., seismic data and well data) and upscaling to a manageable scale and problem size. Uncertainties can exist in input data and solution procedure such that simulation results too are to some extent uncertain. A process known as history matching can involve comparing simulation results to actual field data acquired during production of fluid from a field. Information gleaned from history matching, can provide for adjustments to a model, data, etc., which can help to increase accuracy of simulation.

As an example, a simulator may utilize various types of constructs, which may be referred to as entities. Entities may include earth entities or geological objects such as wells, surfaces, reservoirs, etc. Entities can include virtual representations of actual physical entities that may be reconstructed for purposes of simulation. Entities may include entities based on data acquired via sensing, observation, etc. (e.g., consider entities based at least in part on seismic data and/or other information). As an example, an entity may be characterized by one or more properties (e.g., a geometrical pillar grid entity of an earth model may be characterized by a porosity property, etc.). Such properties may represent one or more measurements (e.g., acquired data), calculations, etc.

As an example, a simulator may utilize an object-based software framework, which may include entities based on pre-defined classes to facilitate modeling and simulation. As an example, an object class can encapsulate reusable code and associated data structures. Object classes can be used to instantiate object instances for use by a program, script, etc. For example, borehole classes may define objects for representing boreholes based on well data. A model of a basin, a reservoir, etc. may include one or more boreholes where a borehole may be, for example, for measurements, injection, production, etc. As an example, a borehole may be a wellbore of a well, which may be a completed well (e.g., for production of a resource from a reservoir, for injection of material, etc.).

While several simulators are illustrated in the example of FIG. 1, one or more other simulators may be utilized, additionally or alternatively. For example, consider the VISAGE geomechanics simulator (SLB, Houston Texas) or the PIPESIM network simulator (SLB, Houston Texas), etc. The VISAGE simulator includes finite element numerical solvers that may provide simulation results such as, for example, results as to compaction and subsidence of a geologic environment, well and completion integrity in a geologic environment, cap-rock and fault-seal integrity in a geologic environment, fracture behavior in a geologic environment, thermal recovery in a geologic environment, CO2 disposal, etc. The PIPESIM simulator includes solvers that may provide simulation results such as, for example, multiphase flow results (e.g., from a reservoir to a wellhead and beyond, etc.), flowline and surface facility performance, etc. The PIPESIM simulator may be integrated, for example, with the AVOCET production operations framework (SLB, Houston Texas). As an example, a reservoir or reservoirs may be simulated with respect to one or more enhanced recovery techniques (e.g., consider a thermal process such as steam-assisted gravity drainage (SAGD), etc.). As an example, the PIPESIM simulator may be an optimizer that can optimize one or more operational scenarios at least in part via simulation of physical phenomena. The MANGROVE simulator (SLB, Houston, Texas) provides for optimization of stimulation design (e.g., stimulation treatment operations such as hydraulic fracturing) in a reservoir-centric environment. The MANGROVE framework can combine scientific and experimental work to predict geomechanical propagation of hydraulic fractures, reactivation of natural fractures, etc., along with production forecasts within 3D reservoir models (e.g., production from a drainage area of a reservoir where fluid moves via one or more types of fractures to a well and/or from a well). The MANGROVE framework can provide results pertaining to heterogeneous interactions between hydraulic and natural fracture networks, which may assist with optimization of the number and location of fracture treatment stages (e.g., stimulation treatment(s)), for example, to increased perforation efficiency and recovery.

As an example, data can include geochemical data. For example, consider data acquired using X-ray fluorescence (XRF) technology, Fourier transform infrared spectroscopy (FTIR) technology and/or wireline geochemical technology.

As an example, one or more probes may be deployed in a bore via a wireline or wirelines. As an example, a probe may emit energy and receive energy where such energy may be analyzed to help determine mineral composition of rock surrounding a bore. As an example, nuclear magnetic resonance may be implemented (e.g., via a wireline, downhole NMR probe, etc.), for example, to acquire data as to nuclear magnetic properties of elements in a formation (e.g., hydrogen, carbon, phosphorous, etc.).

As an example, lithology scanning technology may be employed to acquire and analyze data. For example, consider the LITHO SCANNER technology (SLB, Houston, Texas). As an example, a LITHO SCANNER tool may be or include a gamma ray spectroscopy tool.

As an example, a tool may be positioned to acquire information in a portion of a borehole. Analysis of such information may reveal vugs, dissolution planes (e.g., dissolution along bedding planes), stress-related features, dip events, etc. As an example, a tool may acquire information that may help to characterize a fractured reservoir, optionally where fractures may be natural and/or artificial (e.g., hydraulic fractures). Such information may assist with completions, stimulation treatment, etc. As an example, information acquired by a tool may be analyzed using a framework such as the aforementioned TECHLOG framework.

As an example, a workflow may utilize one or more types of data for one or more processes (e.g., stratigraphic modeling, basin modeling, completion designs, drilling, production, injection, etc.). As an example, one or more tools may provide data that can be used in a workflow or workflows that may implement one or more frameworks (e.g., PETREL, TECHLOG, PETROMOD, ECLIPSE, etc.).

In the example of FIG. 1, drilling may be performed in the geologic environment 150, for example, to access the reservoir 151, which may be accessed from land or offshore. In FIG. 1, the downhole equipment 154 may be, for example, part of a bottom hole assembly (BHA). The BHA may be used to drill a well. The downhole equipment 154 may communicate information to equipment at the surface, and may receive instructions and information from the equipment at the surface. During a well construction process, a variety of operations (such as cementing, wireline evaluation, testing, etc.) may be conducted. In such embodiments, data collected by tools and sensors and used for reasons such as reservoir characterization may be collected and transmitted.

A well may include a substantially horizontal portion (e.g., lateral portion) that may intersect with one or more fractures. For example, a well in a shale formation may pass through natural fractures, artificial fractures (e.g., hydraulic fractures), or a combination thereof. Such a well may be constructed using directional drilling techniques as described herein. However, these same techniques may be used in connection with other types of directional wells (such as slant wells, S-shaped wells, deep inclined wells, and others) and are not limited to horizontal wells.

Figure 2:
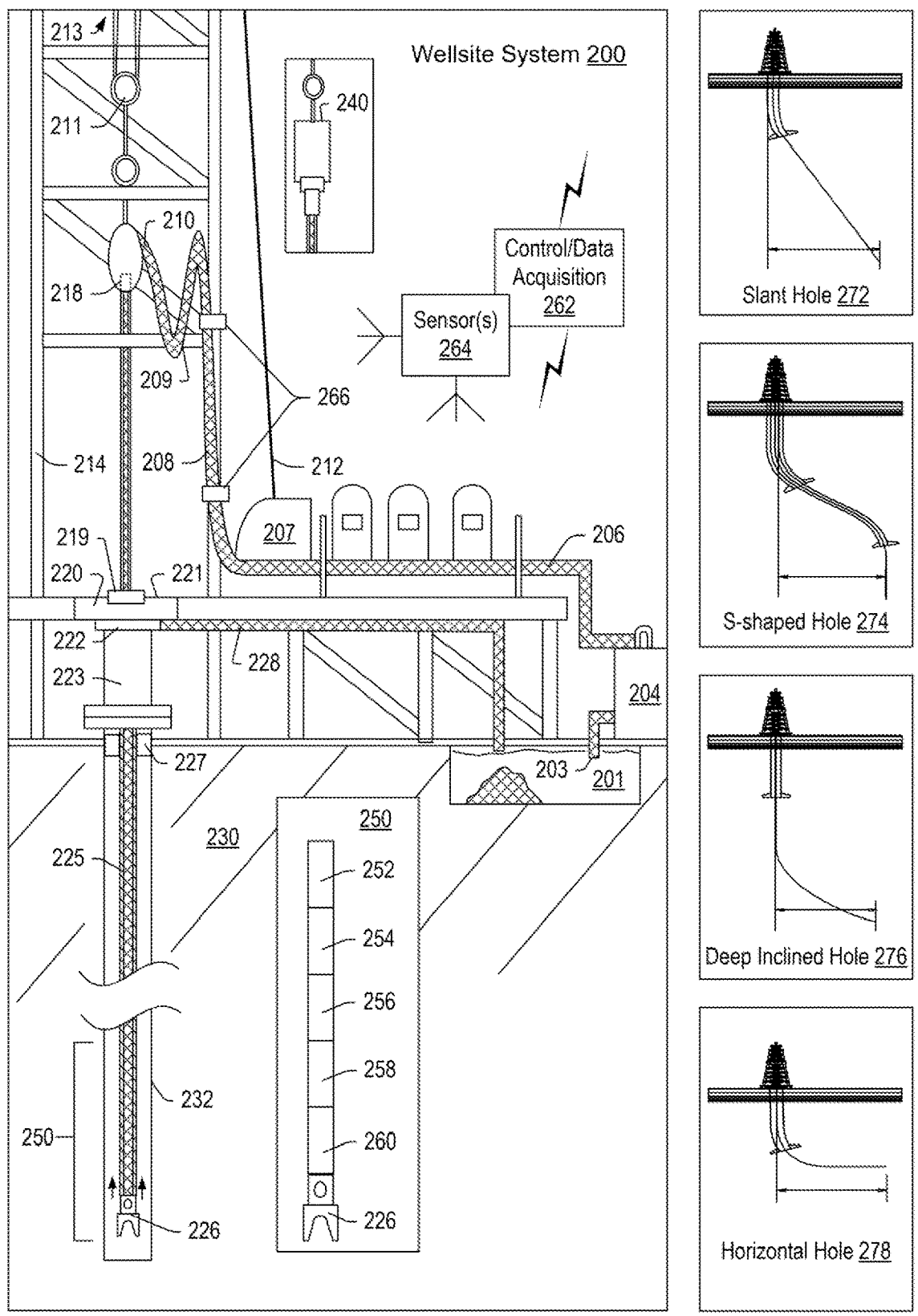
FIG. 2 shows an example of a system.

FIG. 2 shows an example of a wellsite system 200 (e.g., at a wellsite that may be onshore or offshore). As shown, the wellsite system 200 can include a mud tank 201 for holding mud and other material (e.g., where mud can be a drilling fluid), a suction line 203 that serves as an inlet to a mud pump 204 for pumping mud from the mud tank 201 such that mud flows to a vibrating hose 206, a drawworks 207 for winching drill line or drill lines 212, a standpipe 208 that receives mud from the vibrating hose 206, a kelly hose 209 that receives mud from the standpipe 208, a gooseneck or goosenecks 210, a traveling block 211, a crown block 213 for carrying the traveling block 211 via the drill line or drill lines 212, a derrick 214, a kelly 218 or a top drive 240, a kelly drive bushing 219, a rotary table 220, a drill floor 221, a bell nipple 222, one or more blowout preventors (BOPs) 223, a drillstring 225, a drill bit 226, a casing head 227 and a flow pipe 228 that carries mud and other material to, for example, the mud tank 201.

In the example system of FIG. 2, a borehole 232 is formed in subsurface formations 230 by rotary drilling; noting that various example embodiments may also use one or more directional drilling techniques, equipment, etc.

As shown in the example of FIG. 2, the drillstring 225 is suspended within the borehole 232 and has a drillstring assembly 250 that includes the drill bit 226 at its lower end. As an example, the drillstring assembly 250 may be a bottom hole assembly (BHA).

The wellsite system 200 can provide for operation of the drillstring 225 and other operations. As shown, the wellsite system 200 includes the traveling block 211 and the derrick 214 positioned over the borehole 232. As mentioned, the wellsite system 200 can include the rotary table 220 where the drillstring 225 pass through an opening in the rotary table 220.

As shown in the example of FIG. 2, the wellsite system 200 can include the kelly 218 and associated components, etc., or a top drive 240 and associated components. As to a kelly example, the kelly 218 may be a square or hexagonal metal/alloy bar with a hole drilled therein that serves as a mud flow path. The kelly 218 can be used to transmit rotary motion from the rotary table 220 via the kelly drive bushing 219 to the drillstring 225, while allowing the drillstring 225 to be lowered or raised during rotation. The kelly 218 can pass through the kelly drive bushing 219, which can be driven by the rotary table 220. As an example, the rotary table 220 can include a master bushing that operatively couples to the kelly drive bushing 219 such that rotation of the rotary table 220 can turn the kelly drive bushing 219 and hence the kelly 218. The kelly drive bushing 219 can include an inside profile matching an outside profile (e.g., square, hexagonal, etc.) of the kelly 218; however, with slightly larger dimensions so that the kelly 218 can freely move up and down inside the kelly drive bushing 219.

As to a top drive example, the top drive 240 can provide functions performed by a kelly and a rotary table. The top drive 240 can turn the drillstring 225. As an example, the top drive 240 can include one or more motors (e.g., electric and/or hydraulic) connected with appropriate gearing to a short section of pipe called a quill, that in turn may be screwed into a saver sub or the drillstring 225 itself. The top drive 240 can be suspended from the traveling block 211, so the rotary mechanism is free to travel up and down the derrick 214. As an example, a top drive 240 may allow for drilling to be performed with more joint stands than a kelly/rotary table approach.

In the example of FIG. 2, the mud tank 201 can hold mud, which can be one or more types of drilling fluids. As an example, a wellbore may be drilled to produce fluid, inject fluid or both (e.g., hydrocarbons, minerals, water, etc.).

In the example of FIG. 2, the drillstring 225 (e.g., including one or more downhole tools) may be composed of a series of pipes threadably connected together to form a long tube with the drill bit 226 at the lower end thereof. As the drillstring 225 is advanced into a wellbore for drilling, at some point in time prior to or coincident with drilling, the mud may be pumped by the pump 204 from the mud tank 201 (e.g., or other source) via the lines 206, 208 and 209 to a port of the kelly 218 or, for example, to a port of the top drive 240. The mud can then flow via a passage (e.g., or passages) in the drillstring 225 and out of ports located on the drill bit 226 (see, e.g., a directional arrow). As the mud exits the drillstring 225 via ports in the drill bit 226, it can then circulate upwardly through an annular region between an outer surface(s) of the drillstring 225 and surrounding wall(s) (e.g., open borehole, casing, etc.), as indicated by directional arrows. In such a manner, the mud lubricates the drill bit 226 and carries heat energy (e.g., frictional or other energy) and formation cuttings to the surface where the mud (e.g., and cuttings) may be returned to the mud tank 201, for example, for recirculation (e.g., with processing to remove cuttings, etc.).

The mud pumped by the pump 204 into the drillstring 225 may, after exiting the drillstring 225, form a mudcake that lines the wellbore which, among other functions, may reduce friction between the drillstring 225 and surrounding wall(s) (e.g., borehole, casing, etc.). A reduction in friction may facilitate advancing or retracting the drillstring 225. During a drilling operation, the entire drillstring 225 may be pulled from a wellbore and optionally replaced, for example, with a new or sharpened drill bit, a smaller diameter drillstring, etc. As mentioned, the act of pulling a drillstring out of a hole or replacing it in a hole is referred to as tripping. A trip may be referred to as an upward trip or an outward trip or as a downward trip or an inward trip depending on trip direction.

As an example, consider a downward trip where upon arrival of the drill bit 226 of the drillstring 225 at a bottom of a wellbore, pumping of the mud commences to lubricate the drill bit 226 for purposes of drilling to enlarge the wellbore. As mentioned, the mud can be pumped by the pump 204 into a passage of the drillstring 225 and, upon filling of the passage, the mud may be used as a transmission medium to transmit energy, for example, energy that may encode information as in mud-pulse telemetry.

As an example, mud-pulse telemetry equipment may include a downhole device configured to effect changes in pressure in the mud to create an acoustic wave or waves upon which information may modulated. In such an example, information from downhole equipment (e.g., one or more modules of the drillstring 225) may be transmitted uphole to an uphole device, which may relay such information to other equipment for processing, control, etc.

As an example, telemetry equipment may operate via transmission of energy via the drillstring 225 itself. For example, consider a signal generator that imparts coded energy signals to the drillstring 225 and repeaters that may receive such energy and repeat it to further transmit the coded energy signals (e.g., information, etc.).

As an example, the drillstring 225 may be fitted with telemetry equipment 252 that includes a rotatable drive shaft, a turbine impeller mechanically coupled to the drive shaft such that the mud can cause the turbine impeller to rotate, a modulator rotor mechanically coupled to the drive shaft such that rotation of the turbine impeller causes said modulator rotor to rotate, a modulator stator mounted adjacent to or proximate to the modulator rotor such that rotation of the modulator rotor relative to the modulator stator creates pressure pulses in the mud, and a controllable brake for selectively braking rotation of the modulator rotor to modulate pressure pulses. In such an example, an alternator may be coupled to the aforementioned drive shaft where the alternator includes at least one stator winding electrically coupled to a control circuit to selectively short the at least one stator winding to electromagnetically brake the alternator and thereby selectively brake rotation of the modulator rotor to modulate the pressure pulses in the mud.

In the example of FIG. 2, an uphole control and/or data acquisition system 262 may include circuitry to sense pressure pulses generated by telemetry equipment 252 and, for example, communicate sensed pressure pulses or information derived therefrom for process, control, etc.

The assembly 250 of the illustrated example includes a logging-while-drilling (LWD) module 254, a measurement-while-drilling (MWD) module 256, an optional module 258, a rotary-steerable system (RSS) and/or motor 260, and the drill bit 226. Such components or modules may be referred to as tools where a drillstring can include a plurality of tools.

As to an RSS, it involves technology utilized for directional drilling. Directional drilling involves drilling into the Earth to form a deviated bore such that the trajectory of the bore is not vertical; rather, the trajectory deviates from vertical along one or more portions of the bore. As an example, consider a target that is located at a lateral distance from a surface location where a rig may be stationed. In such an example, drilling can commence with a vertical portion and then deviate from vertical such that the bore is aimed at the target and, eventually, reaches the target. Directional drilling may be implemented where a target may be inaccessible from a vertical location at the surface of the Earth, where material exists in the Earth that may impede drilling or otherwise be detrimental (e.g., consider a salt dome, etc.), where a formation is laterally extensive (e.g., consider a relatively thin yet laterally extensive reservoir), where multiple bores are to be drilled from a single surface bore, where a relief well is desired, etc.

One approach to directional drilling involves a mud motor; however, a mud motor can present some challenges depending on factors such as rate of penetration (ROP), transferring weight to a bit (e.g., weight on bit, WOB) due to friction, etc. A mud motor can be a positive displacement motor (PDM) that operates to drive a bit (e.g., during directional drilling, etc.). A PDM operates as drilling fluid is pumped through it where the PDM converts hydraulic power of the drilling fluid into mechanical power to cause the bit to rotate.

As an example, a mud motor (e.g., PDM) can be operated in different modes, which can include a rotating mode and a sliding mode. A sliding mode involves drilling with a mud motor rotating the bit downhole without rotating the drillstring from the surface. Such an operation can be conducted when a BHA has been fitted with a bent sub or a bent housing mud motor, or both, for directional drilling. Sliding can be used in building and controlling or adjusting hole angle. In directional drilling, pointing of a bit can be accomplished through a bent sub, which can have a relatively small angle offset from the axis of a drillstring, and a measurement device to determine the direction of offset. Without turning the drillstring, the bit can be rotated with mud flow through the mud motor to drill in the direction it is pointed. With steerable motors, when a desired wellbore direction is attained, the entire drillstring can be rotated to drill straight rather than at an angle. By controlling the amount of hole drilled in the sliding mode versus the rotating mode, a wellbore trajectory can be controlled rather precisely.

As an example, a PDM may operate in a combined rotating mode where surface equipment is utilized to rotate a bit of a drillstring (e.g., a rotary table, a top drive, etc.) by rotating the entire drillstring and where drilling fluid is utilized to rotate the bit of the drillstring. In such an example, a surface RPM (SRPM) may be determined by use of the surface equipment and a downhole RPM of the mud motor may be determined using various factors related to flow of drilling fluid, mud motor type, etc. As an example, in the combined rotating mode, bit RPM can be determined or estimated as a sum of the SRPM and the mud motor RPM, assuming the SRPM and the mud motor RPM are in the same direction.

As an example, a PDM mud motor can operate in a so-called sliding mode, when the drillstring is not rotated from the surface. In such an example, a bit RPM can be determined or estimated based on the RPM of the mud motor.

An RSS can drill directionally where there is continuous rotation from surface equipment, which can alleviate the sliding of a steerable motor (e.g., a PDM). An RSS may be deployed when drilling directionally (e.g., deviated, horizontal, or extended-reach wells). An RSS can aim to minimize interaction with a borehole wall, which can help to preserve borehole quality. An RSS can aim to exert a relatively consistent side force akin to stabilizers that rotate with the drillstring or orient the bit in the desired direction while continuously rotating at the same number of rotations per minute as the drillstring.

The LWD module 254 may be housed in a suitable type of drill collar and can contain one or a plurality of selected types of logging tools. It will also be understood that more than one LWD and/or MWD module can be employed, for example, as represented at by the module 256 of the drillstring assembly 250. Where the position of an LWD module is mentioned, as an example, it may refer to a module at the position of the LWD module 254, the module 256, etc. An LWD module can include capabilities for measuring, processing, and storing information, as well as for communicating with the surface equipment. In the illustrated example, the LWD module 254 may include a seismic measuring device.

The MWD module 256 may be housed in a suitable type of drill collar and can contain one or more devices for measuring characteristics of the drillstring 225 and the drill bit 226. As an example, the MWD tool 254 may include equipment for generating electrical power, for example, to power various components of the drillstring 225. As an example, the MWD tool 254 may include the telemetry equipment 252, for example, where the turbine impeller can generate power by flow of the mud; it being understood that other power and/or battery systems may be employed for purposes of powering various components. As an example, the MWD module 256 may include one or more of the following types of measuring devices: a weight-on-bit measuring device, a torque measuring device, a vibration measuring device, a shock measuring device, a stick slip measuring device, a direction measuring device, and an inclination measuring device.

FIG. 2 also shows some examples of types of holes that may be drilled. For example, consider a slant hole 272, an S-shaped hole 274, a deep inclined hole 276 and a horizontal hole 278.

As an example, a drilling operation can include directional drilling where, for example, at least a portion of a well includes a curved axis. For example, consider a radius that defines curvature where an inclination with regard to the vertical may vary until reaching an angle between about 30 degrees and about 60 degrees or, for example, an angle to about 90 degrees or possibly greater than about 90 degrees.

As an example, a directional well can include several shapes where each of the shapes may aim to meet particular operational demands. As an example, a drilling process may be performed on the basis of information as and when it is relayed to a drilling engineer. As an example, inclination and/or direction may be modified based on information received during a drilling process.

As an example, deviation of a bore may be accomplished in part by use of a downhole motor and/or a turbine. As to a motor, for example, a drillstring can include a positive displacement motor (PDM).

As an example, a system may be a steerable system and include equipment to perform method such as geosteering. As mentioned, a steerable system can be or include an RSS. As an example, a steerable system can include a PDM or of a turbine on a lower part of a drillstring which, just above a drill bit, a bent sub can be mounted. As an example, above a PDM, MWD equipment that provides real time or near real time data of interest (e.g., inclination, direction, pressure, temperature, real weight on the drill bit, torque stress, etc.) and/or LWD equipment may be installed. As to the latter, LWD equipment can make it possible to send to the surface various types of data of interest, including for example, geological data (e.g., gamma ray log, resistivity, density and sonic logs, etc.).

The coupling of sensors providing information on the course of a well trajectory, in real time or near real time, with, for example, one or more logs characterizing the formations from a geological viewpoint, can allow for implementing a geosteering method. Such a method can include navigating a subsurface environment, for example, to follow a desired route to reach a desired target or targets.

As an example, a drillstring can include an azimuthal density neutron (ADN) tool for measuring density and porosity; a MWD tool for measuring inclination, azimuth and shocks; a compensated dual resistivity (CDR) tool for measuring resistivity and gamma ray related phenomena; one or more variable gauge stabilizers; one or more bend joints; and a geosteering tool, which may include a motor and optionally equipment for measuring and/or responding to one or more of inclination, resistivity and gamma ray related phenomena.

As an example, geosteering can include intentional directional control of a wellbore based on results of downhole geological logging measurements in a manner that aims to keep a directional wellbore within a desired region, zone (e.g., a pay zone), etc. As an example, geosteering may include directing a wellbore to keep the wellbore in a particular section of a reservoir, for example, to minimize gas and/or water breakthrough and, for example, to maximize economic production from a well that includes the wellbore.

Referring again to FIG. 2, the wellsite system 200 can include one or more sensors 264 that are operatively coupled to the control and/or data acquisition system 262. As an example, a sensor or sensors may be at surface locations. As an example, a sensor or sensors may be at downhole locations. As an example, a sensor or sensors may be at one or more remote locations that are not within a distance of the order of about one hundred meters from the wellsite system 200. As an example, a sensor or sensor may be at an offset wellsite where the wellsite system 200 and the offset wellsite are in a common field (e.g., oil and/or gas field).

As an example, one or more of the sensors 264 can be provided for tracking pipe, tracking movement of at least a portion of a drillstring, etc.

As an example, the system 200 can include one or more sensors 266 that can sense and/or transmit signals to a fluid conduit such as a drilling fluid conduit (e.g., a drilling mud conduit). For example, in the system 200, the one or more sensors 266 can be operatively coupled to portions of the standpipe 208 through which mud flows. As an example, a downhole tool can generate pulses that can travel through the mud and be sensed by one or more of the one or more sensors 266. In such an example, the downhole tool can include associated circuitry such as, for example, encoding circuitry that can encode signals, for example, to reduce demands as to transmission. As an example, circuitry at the surface may include decoding circuitry to decode encoded information transmitted at least in part via mud-pulse telemetry. As an example, circuitry at the surface may include encoder circuitry and/or decoder circuitry and circuitry downhole may include encoder circuitry and/or decoder circuitry. As an example, the system 200 can include a transmitter that can generate signals that can be transmitted downhole via mud (e.g., drilling fluid) as a transmission medium.

As an example, one or more portions of a drillstring may become stuck. The term stuck can refer to one or more of varying degrees of inability to move or remove a drillstring from a bore. As an example, in a stuck condition, it might be possible to rotate pipe or lower it back into a bore or, for example, in a stuck condition, there may be an inability to move the drillstring axially in the bore, though some amount of rotation may be possible. As an example, in a stuck condition, there may be an inability to move at least a portion of the drillstring axially and rotationally.

As to the term "stuck pipe", this can refer to a portion of a drillstring that cannot be rotated or moved axially. As an example, a condition referred to as "differential sticking" can be a condition whereby the drillstring cannot be moved (e.g., rotated or reciprocated) along the axis of the bore. Differential sticking may occur when high-contact forces caused by low reservoir pressures, high wellbore pressures, or both, are exerted over a sufficiently large area of the drillstring. Differential sticking can have time and financial cost.

As an example, a sticking force can be a product of the differential pressure between the wellbore and the reservoir and the area that the differential pressure is acting upon. This means that a relatively low differential pressure (delta p) applied over a large working area can be just as effective in sticking pipe as can a high differential pressure applied over a small area.

As an example, a condition referred to as "mechanical sticking" can be a condition where limiting or prevention of motion of the drillstring by a mechanism other than differential pressure sticking occurs. Mechanical sticking can be caused, for example, by one or more of junk in the hole, wellbore geometry anomalies, cement, keyseats or a buildup of cuttings in the annulus.

Figure 3:
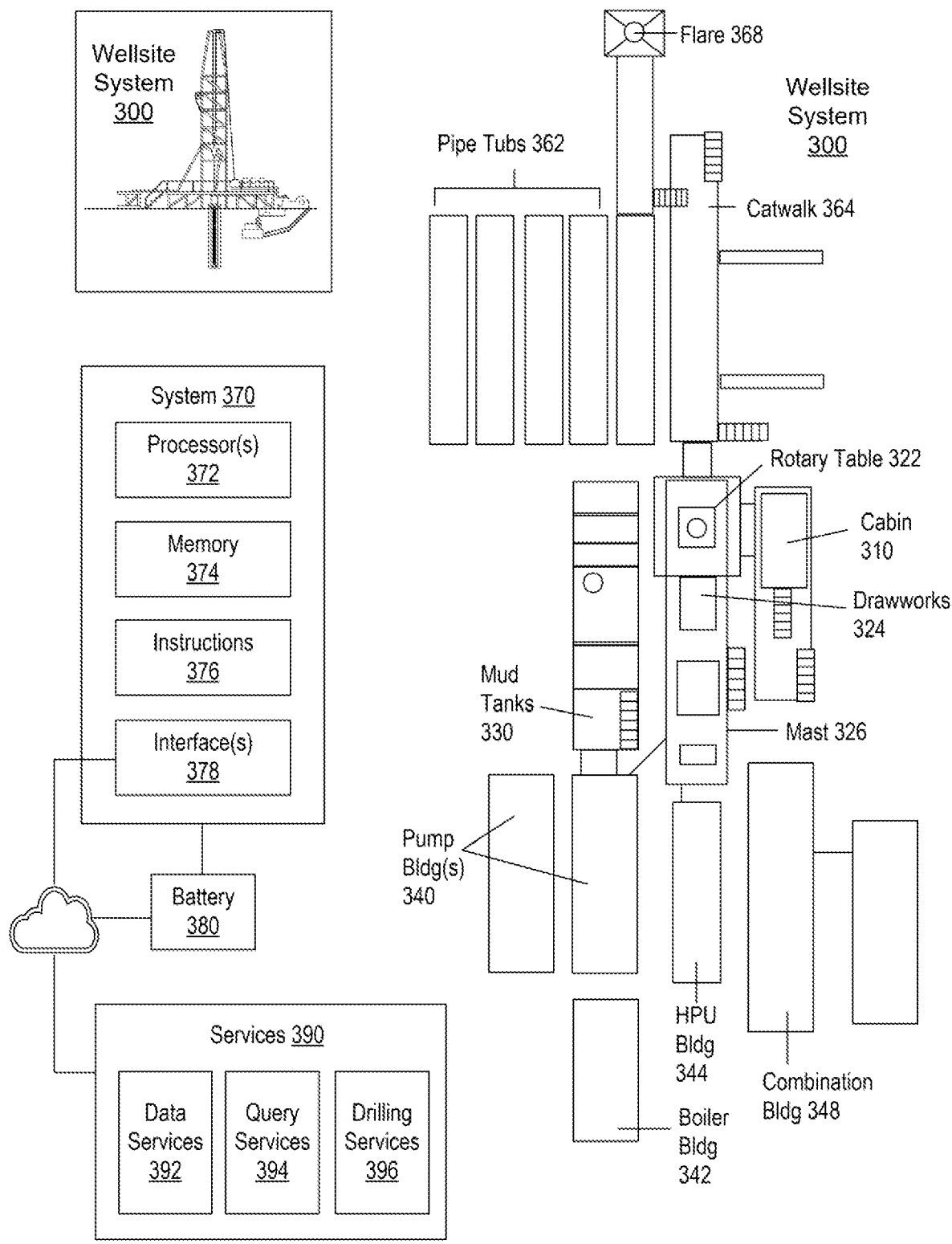
FIG. 3 shows an example of a system.

FIG. 3 shows an example of a wellsite system 300, specifically, FIG. 3 shows the wellsite system 300 in an approximate side view and an approximate plan view along with a block diagram of a system 370.

In the example of FIG. 3, the wellsite system 300 can include a cabin 310, a rotary table 322, drawworks 324, a mast 326 (e.g., optionally carrying a top drive, etc.), mud tanks 330 (e.g., with one or more pumps, one or more shakers, etc.), one or more pump buildings 340, a boiler building 342, an HPU building 344 (e.g., with a rig fuel tank, etc.), a combination building 348 (e.g., with one or more generators, etc.), pipe tubs 362, a catwalk 364, a flare 368, etc. Such equipment can include one or more associated functions and/or one or more associated operational risks, which may be risks as to time, resources, and/or humans.

As shown in the example of FIG. 3, the wellsite system 300 can include a system 370 that includes one or more processors 372, memory 374 operatively coupled to at least one of the one or more processors 372, instructions 376 that can be, for example, stored in the memory 374, and one or more interfaces 378. As an example, the system 370 can include one or more processor-readable media that include processor-executable instructions executable by at least one of the one or more processors 372 to cause the system 370 to control one or more aspects of the wellsite system 300. In such an example, the memory 374 can be or include the one or more processor-readable media where the processor-executable instructions can be or include instructions. As an example, a processor-readable medium can be a computer-readable storage medium that is not a signal and that is not a carrier wave.

FIG. 3 also shows a battery 380 that may be operatively coupled to the system 370, for example, to power the system 370. As an example, the battery 380 may be a back-up battery that operates when another power supply is unavailable for powering the system 370. As an example, the battery 380 may be operatively coupled to a network, which may be a cloud network. As an example, the battery 380 can include smart battery circuitry and may be operatively coupled to one or more pieces of equipment via a SMBus or other type of bus.

In the example of FIG. 3, services 390 are shown as being available, for example, via a cloud platform. Such services can include data services 392, query services 394 and drilling services 396. As an example, the services 390 may be part of a system such as the system 100 of FIG. 1 (e.g., consider planning services and/or operational services). As an example, the services 390 can include one or more services for directional drilling (e.g., consider a computational framework that can provide for one or more services that utilize real-time data to estimate one or more parameters, etc.).

As an example, the system 370 may be utilized to generate one or more rate of penetration drilling parameter values, which may, for example, be utilized to control one or more drilling operations.

As an example, a method can include automating operations of one or more types of downhole tools. For example, consider automating operations of one or more of mud motors, rotary steerable systems (RSSs) and at-bit steerable systems (ABSSs). As an example, one or more of such types of equipment, systems, etc., may be implemented using one or more features of the system 200 of FIG. 2.

As an example, an ABSS can include an actuator with a pressure drop range, hold inclination and azimuth (HIA), and dual downlinking capabilities. As an example, an ABSS can include onboard near-bit sensors that can acquire continuous six-axis inclination and azimuth measurements with a 6-ft range, and optional natural gamma ray and azimuthal images with a 9-ft range. As an example, an ABSS can include one of more features of one or more of the NEO-STEER family of ABSSs (SLB, Houston, Texas).

As an example, a framework can provide for considering information from planning with offset analysis and adapting a hybrid model for real time execution; considering various downhole automation possibilities at a given time to optimize a recommended working trajectory execution, taking advantage of tool capabilities and minimizing unnecessary surface actions; considering real-time data information and derived tool health as well as tool state estimation at a given point in time to optimize current ongoing recommendation and recommend real time correction to handle deviations when it occurs. Such an approach can involve different computations and actions that can output an optimal recommendation, for example, for a fastest path with minimized risk based on the drilling constraints and the drilling context.

As to an optimal path recommendation, derivation can be via a framework, which may provide for a single-target approach and/or a multi-target approach and, for example, which may account for various factors, which may include energy, emissions, etc.

Figure 4:
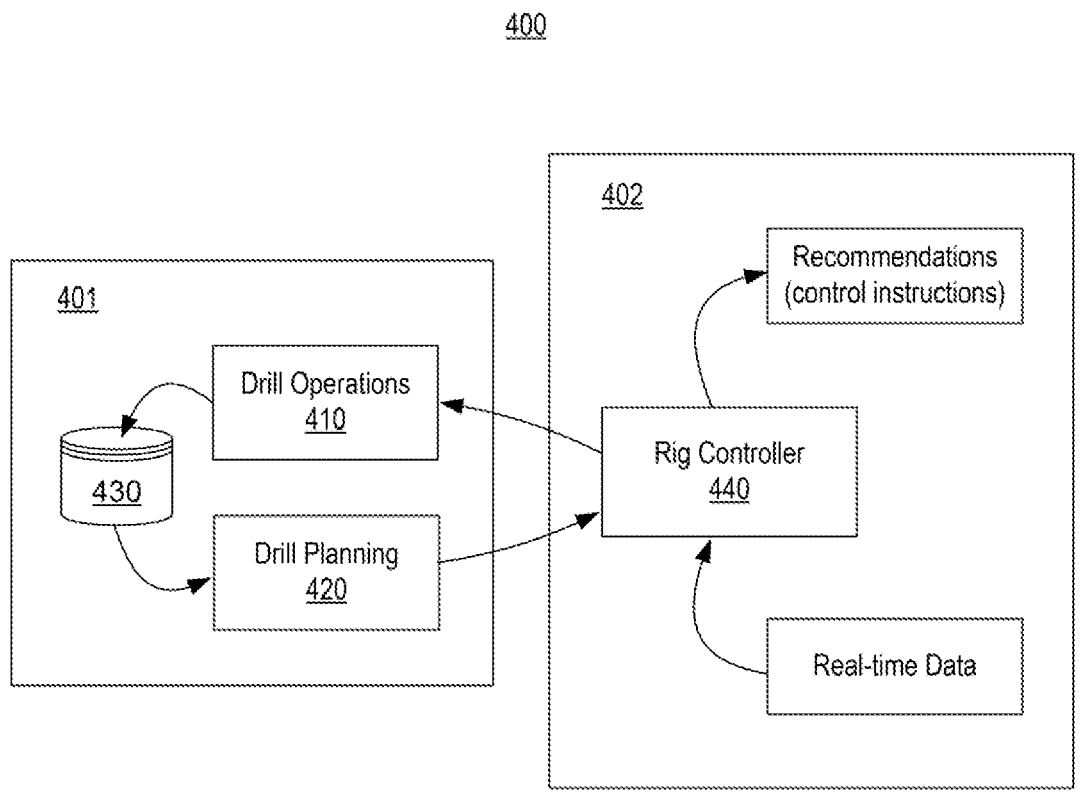
FIG. 4 shows an example of a system.

FIG. 4 shows an example of a system 400 that includes offsite equipment 401 (e.g., remote) and onsite equipment 402 (e.g., local). As shown, the offsite equipment 401 can include a drill operations framework 410, a drill planning framework 420 and a database 430 and the onsite equipment 402 can include a controller 440 that can receive real-time data and output recommendations such as control instructions to control onsite equipment. In such an example, the drill operations framework 410 may provide for steering sheets, execution parameters, etc., and the drill planning framework 420 may provide for evaluation of steering responses and statistics. As shown, the controller 440 can output information to the drill operations framework 410 and receive information from the drill planning framework 420. The system 400 can include plan generation features for real-time plan generation during drilling operations execution phase and/or plan generation during a planning phase. The system 400 can be utilized for one or more types of drilling (e.g., rotary, mud motor, RSS, ABSS, etc.). The system 400 can operate loops, which can include at least one real-time loop that provides for control of equipment to perform drilling operations.

A system such as the system 400 may utilize various functions and constraints for generation of plans, which may provide for single or multiple target aiming. As explained, a plan can be generated that aims to provide for drilling operations for a multiwell pad.

Various challenges can arise in pad/rig drilling in onshore and/or offshore sites in a planning stage and/or in an execution stage as crowded well placements can pose substantial risks. Such challenges can stem from multiple well heads gathered within a relatively small area, which makes an escape strategy for anti-collision challenging. As an example, a system can automate and/or semi-automate a trajectory design workflow. Such a system may use various types of inputs, which can include, for example, surface locations, targets, and optional trajectory pattern inputs to generate trajectories on a pad.

A pad can be a temporary drilling site, for example, constructed of local materials such as gravel, shell, or even wood, noting that an offshore pad can be a steel plate with slots. For some long-drilling-duration, deep wells, such as the ultradeep wells of western Oklahoma, or some regulatory jurisdictions such as the Netherlands, pads may be paved with asphalt or concrete. After a drilling operation is over, most of the pad is usually removed or plowed back into the ground. Where a pad includes multiple wells, it can be referred to as a multiwell pad. As to number of wells, a multiwell pad may include from two to over one-hundred wells.

As an example, a system can utilize existing pad data such as from offset wells, which can be at one or more other pads. For example, consider one or more machine learning techniques that can be applied to pad data to generate a trained machine learning model that can generate output based on input. In such an example, an output may be an initial template for a pad where the initial template may include initial well trajectories. In such an example, the initial well trajectories may be shaped and dimensioned to provide some number of anti-collision assurances. As an example, an initial template may be generated using constraints and trajectory shapes that are associated with one or more anti-collision strategies. Data analytics of pads on land and/or offshore may be implemented to help identify principal features to classify pads into enumerable pad templates. Such features may include, for example, surface slot layout (e.g., line, matrix, or circle, etc.), nudge strategy (e.g., S nudge, J nudge, or mixed on a single pad), and landing preferences (e.g., single curve landing or multiple curves), etc. As an example, a template can provide a pattern as to how a trajectory connects surface locations and targets, indications of an S nudge, a J nudge, alignment, nudge kickoff, build kickoff, etc. As an example, a template may specify that a landing is to be achieved using a single curve or optionally one or more curves. For example, consider a build kickoff point (build KOP) that can be a starting point for a curve (e.g., a curve start point) that has an ending point (e.g., a curve end point) that can be a landing point from which a straight line may extend to a target, which may be a target line.

As an example, a system can provide for generation of trajectories for a multiwell pad using one or more templates where control points (e.g., key points) can be utilized for curve forming, defining straight line portions, etc., where one or more control points can be one or more geometric points that may or may not lie on a trajectory. Such a system may provide for computation of point positions (e.g., control points and/or trajectory points) and adjustments to point positions, which may be performed using adjustments to one or more control points. In such an approach, geometric techniques can be implemented rapidly to construct trajectories for a pad where the trajectories can have various anti-collision assurances. As an example, a pad design with multiple trajectories can be output with various associated specifications that can pertain to drilling. For example, consider torque and drag (T&D), BHA specifications, hook load (HKLD), weight on bit (WOB), etc., which may be implemented by a drilling framework to expedite drilling of the trajectories. As an example, during drilling, a re-planning process may be called for responsive to data acquired using one or more sensors. For example, if T&D differs from specified T&D, if an obstacle is encountered (e.g., as evidenced by HKLD and/or WOB), then a drilling framework may instruct a trajectory generation framework to re-plan (e.g., re-design) one or more trajectories from a multiwell pad. As explained, where a system implements a geometric control point based approach, planning and/or re-planning may be performed expeditiously in a manner that accounts for various constraints.

As to the term nudge, it can refer to a process whereby a trajectory is altered in one or more manners. For example, a nudge may alter a trajectory in a multidimensional coordinate space (e.g., consider a north nudge, an east nudge, etc.). As an example, a nudge may alter a trajectory with respect to an angular direction (e.g., an inclination, an azimuth, etc.). As an example, a nudge may be a noun that refers to a particular shape of a portion of a trajectory of a well such as an S nudge or a J nudge, where "S" and "J" correspond to shapes. As to an S nudge it may have a first, upper vertical end and a second, lower vertical end where a curve exists between the first and second ends or, for example, an upper end may be non-vertical (e.g., a portion with a non-zero inclination). Such a nudge may be implemented as part of an anti-collision strategy and/or to avoid one or more subsurface objects and/or regions. In practice, introduction of an S nudge can complicate drilling in that a drillstring has to drill the trajectory in a manner that deviates from straight (e.g., deviates from vertical, etc.). An S nudge can have at least two arc curves between two vertical portions (e.g., or inclined if an S nudge is introduced from an inclined well), where one bends up (build) and one bends down (drop), while a J nudge may have one or multiple arc curves which bend up (build). During drilling, one or more techniques may be implemented to create a curve in a borehole that aims to conform to a curved trajectory (e.g., a planned trajectory).

Another aspect of a trajectory is referred to as a dogleg, which may be characterized in part by a dogleg severity (DLS or dls). A dogleg can be defined as a particularly crooked place in a wellbore where the trajectory of the wellbore in three-dimensional space changes relatively rapidly. While a dogleg is sometimes created intentionally by directional drillers, the term may also refer to a section of a hole that changes direction faster than expected or desired, possibly with detrimental side effects. In surveying wellbore trajectories, a standard calculation of dogleg severity can be made, usually expressed in two-dimensional degrees per 100 feet (e.g., or degrees per 30 m) of wellbore length.

Doglegs can account for various aspects of drilling, well completions, well treatments, etc. For example, a planned casing string may be taken into account such that it can fit through a curved section. As another example, the impact of repeated abrasion by a drillstring in a particular location of a dogleg may be taken into account to help reduce risks of one or more worn spots (e.g., one or more keyseats) in which a BHA may potentially stick. As yet another example, consider accounting for casing that can be cemented through a dogleg where a dogleg is designed and/or drilled in a manner that aims to reduce risk of casing wear due to higher contact forces between a drillstring and an inner diameter surface of the casing through the dogleg. Other aspects that can be taken into account can include, for example, BHA stiffness and/or resiliency such that a BHA or BHAs can fit through the dogleg section and/or friction to a drillstring, which can increase likelihood of getting stuck or not reaching a planned target. In various instances, if a dogleg impairs a well, one or more remedial actions may be taken, such as, for example, reaming or underreaming through the dogleg, or even sidetracking in extreme situations.

As an example, a system may generate a plan for a multiwell pad with trajectories that are amenable to one or more remedial actions. For example, consider a system that can generate a plan where the plan can be rendered to a display with information as to various regions as to where one or more remedial action may be available if one or more types of issues arise during drilling, completing, injection, production, etc.

As an example, a system may generate and optimize a layout and geometry of trajectories on a common pad. In one embodiment, each pad template can be generated accordingly. In one embodiment, given surface locations and subsurface targets information for pad wells, assuming the expected wells are horizontal wells with similar target line direction, a system may determine a nudge kickoff depth (nudge KOP specified using depth), a nudge inclination (e.g., specified using an angle) and an azimuth (e.g., specified using an angle) to maximize well trajectory separation and landing to target lines with relatively simple geometry such as, for example, single curve. As explained, drilling can be facilitated where one or more curves are designed in a manner that takes into account one or more types of constraints. For example, a curve may be a curve designed through use of a minimum curvature technique such that issues are less likely to arise during drilling, completions, etc. As an example, a system can utilize specified targets, which may be connected by one or more curve-hold combination sequences. As to output from a system, pad trajectories may be expected to minimize collision risks and optimize drilling performance under given conditions.

As to inclination, it can be defined as the deviation from vertical, irrespective of compass direction, expressed in degrees. Inclination may be measured initially with a pendulum mechanism, and confirmed with MWD accelerometers or gyroscopes. For most vertical wellbores, inclination may be the sole measurement of a path of a wellbore. For intentionally deviated wellbores, or wells close to legal boundaries, directional information may be measured.

As to azimuth, it can be defined as the compass direction of a directional survey or of a wellbore as planned and/or measured by a directional survey. The azimuth is usually specified in degrees with respect to the geographic or magnetic north pole.

In one embodiment, to evaluate the results and assist users for decision making, a system may implement one or more performance indicators (e.g., key performance indicator (KPI)), which may be output via an estimation table. As an example, an estimation table of KPIs may be generated for output sets of pad trajectories, with information of geometry as well as anti-collision, torque and drag (T&D), and other factors. As an example, a system can provide for comparison of trajectories and, for example, adjustments on a pad level. Such an approach may lessen demand to iterate one by one. Once pad trajectories are finalized, a system may include features that provide for fine-tuning single borehole trajectories.

As an example, a system can define multiple trajectories which are drillable and satisfy constraints such as, for example, one or more anti-collision constraints. Such a system can generate trajectories that may be visualized and evaluated. The approach may use a pre-trained model from historic data to recommend initial design patterns and parameters. The layout and geometry of the well trajectories for the pad may be optimized to balance the need of maximizing the trajectory separation with other drilling concerns.

As an example, a system can handle complex trajectory design where many trajectories are to be designed. Such a system may improve efficiency and lessen demand for human labor when a workflow calls for design of many trajectories gathering within a comparably small area of a field.

Figure 5:
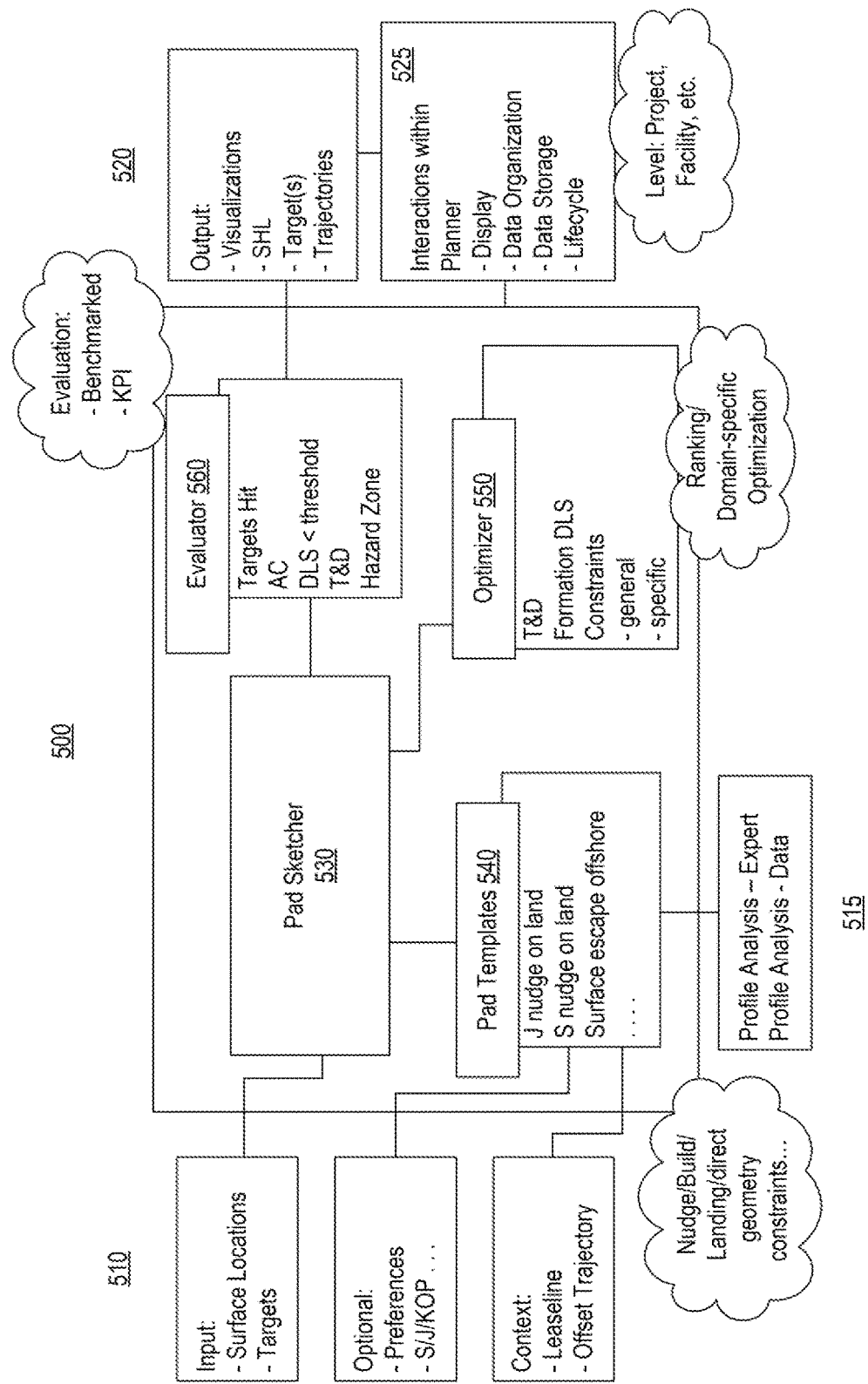
FIG. 5 shows an example of a system.

FIG. 5 shows an example of a system 500 that includes one or more input blocks 510, an analysis input block 515, one or more output blocks 520, an interactions block 525, a pad sketcher component 530, a pad templates component 540, an optimizer component 550, and an evaluator component 560 (e.g., optionally providing for ranking as a ranker). As shown, the pad templates component 540 and the optimizer component 550 can be operatively coupled to the pad sketcher component 530. In such an approach, the pad sketcher component 530 can generate pad designs that can be assessed by the evaluator component 560, which can, for example, provide output that can be utilized in the output block 520, optionally with various interactions per the interactions block 525.

As an example, a pad sketcher component may be provided to generate trajectories based on given inputs and context data. In such an example, the pad sketcher component may use inputs that include surface locations, targets and positions. As an example, additional data may be provided that describes a detailed setup about trajectories to design and one or more offset wells to be considered, including, for example: what trajectory profile is desired, such as a J nudge single curve landing or other detailed setups; and whether there are existing offset wells or definitive designs to consider for anti-collision. A pad sketcher component can generate trajectories on a pad, which may be assessed by one or more other components.

As an example, a pad template component may define and/or generate a pad trajectory template and one or more techniques to achieve trajectories and recommend proper templates from offset well analysis for the new pad. As an example, a pad template component may be driven by one or more machine learning models (one or more ML models). As explained, a trained ML model can receive input and generate output, which may be a template or, for example, a selected template. For example, consider a trained ML model that can determine what template is an optimal template for a particular design problem. In such an example, the trained ML model can utilize data from offset wells that have been designed and drilled, and optionally completed and put into operation. Offset wells may provide optional data (e.g., directly provided by a user, accessed from one or more databases, etc.) and may also provide suggestions to recommend a pad template configuration, as appropriate. As an example, a template may be selected via interaction with a graphical user interface (GUI), which may provide a number of templates, optionally ranked based on an algorithmic technique that receives at least some input information regarding a multiwell pad.

As an example, an evaluator component can evaluate trajectories output by a pad sketcher component, for example, against one or more specified KPIs and/or one or more other criteria. As an example, KPIs may include, but are not limited to, whether targets are hit, geometric index (e.g., Directional Drilling Index (DDI), Along Hole Departure (AHD), Extended Reach Ratio (ERR)), anti-collision indicator (e.g., separation factor, minimum allowable separation against new designs in this pad, definitive designs and existing wells defined from other sources, etc.), torque and drag performance (T&D, final value and/or along one or more portions of a trajectory), hydraulics validation, well stability, whether hazard zones can be avoided, etc.

As an example, an optimizer component may adjust one or more trajectory parameters to optimize one or more KPIs under given constraints through either single target optimization which can reflect the combination effect of the required KPIs or multi-target optimization, for example, to generate a Pareto surface or Pareto frontier and provide several solution candidates.

As explained, a system may operate automatically or semi-automatically such that human intervention and/or interactions can be performed. As an example, a system may provide for human interaction to set up trajectory preference in more detail through optional input data. One example implementation for manual intervention for trajectories can be that one or more of nudge inclination and nudge azimuth can be defined through batch and/or individual manual adjustment, which can be used for an initial draft pad trajectory design and/or for adjustment after draft pad trajectories have been generated and one or more users want to have some refinement for the trajectories.

As an example, a pad sketcher component may be implemented to perform part of a workflow that generates pad trajectories based on one or more existing pad templates. A pad sketcher component may use basic input for pad information, including the surface locations for each well, the target points, dogleg severity (DLS or dls) for nudge build, nudge drop and build sections. As an example, target assignment for wells can be predefined with user input and/or computed by a system, for example, based on the geometrical characteristics of surface locations and targets. As an example, optional input can include detailed trajectory geometry parameters setup and/or parameter range setup. As an example, trajectory optional geometry parameters can include, without limitation, nudge inclination, nudge azimuth, nudge kickoff point, etc. Such parameters may be used to generate points that are used to link up trajectories.

As mentioned, a system may include a variety of techniques for handling trajectory generation. For example, consider techniques that can be associated with scenarios, which may be referred to as cases (e.g., Case 1, Case 2, etc.), which may be appropriately selected and executed to design one or more portions of one or more trajectories.

As an example, candidate techniques may operate in part based on assignment of a surface location and one or more targets to each well. For example, consider one or more techniques that can be setup to: use a straight line segment to connect a surface location and one or more targets and to minimize total length of a connecting line length (e.g., iteratively, line-by-line, over line portions, etc.); and use parallel straight lines to fit the target points, and where the line number is equals to the surface location number, to minimize a total displacement of targets from the parallel straight lines and assign each line to one surface location to minimize the overlapping or collision of the trajectories.

Figure 6:
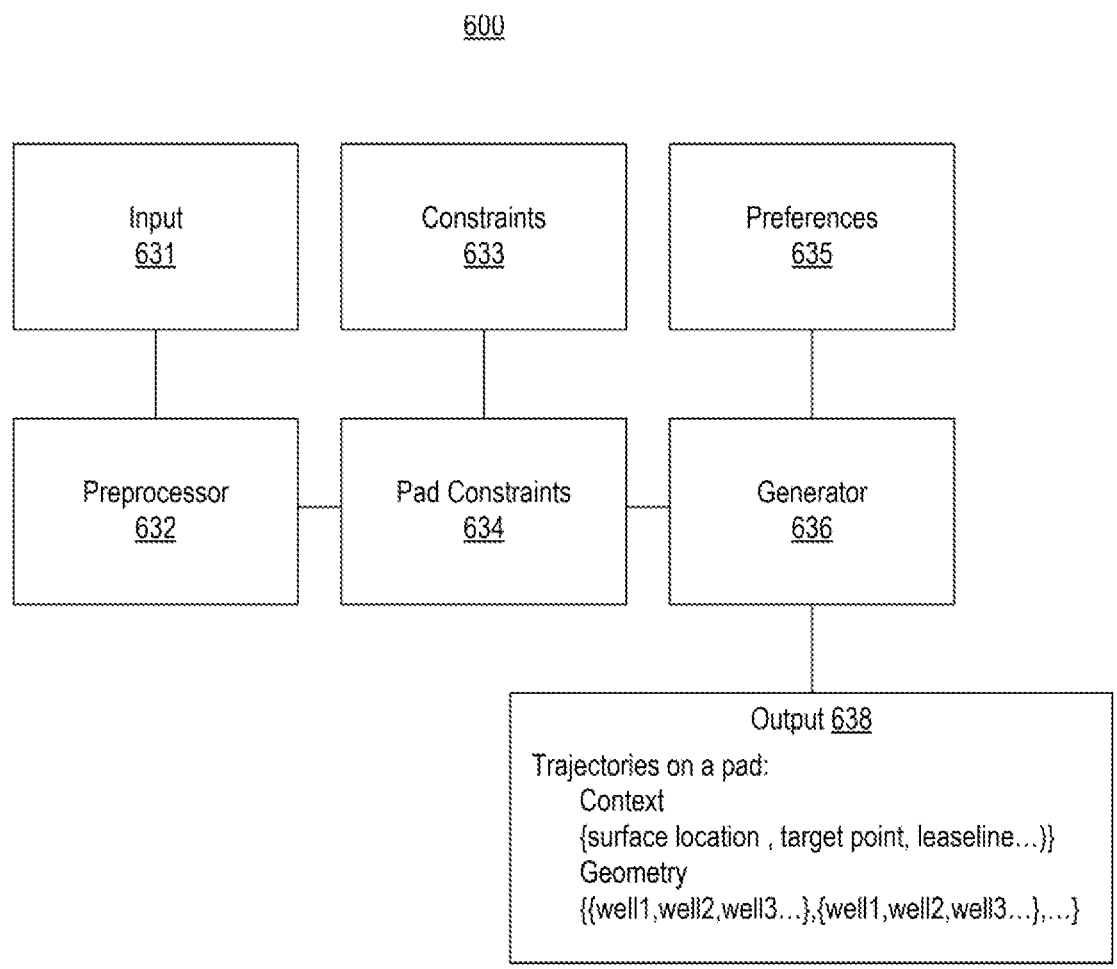
FIG. 6 shows an example of a system.

FIG. 6 shows an example of a pad sketcher system 600 that includes an input block 631, a preprocessor component 632, a constraints block 633, a pad constraints component 634, a preferences block 635 and a generator component 636, which may be a type of computational solver that can generate output, for example, as indicated in an output block 638. As shown in the example of FIG. 6, the output block 638 can include output for trajectories on a pad in terms of context and geometry where context may include surface location, target point(s), leaseline, etc., information and where geometry may include geometric information for each well (e.g., well1, well2, well3, etc.).

In the example of FIG. 6, the input block 631 may provide information such as surface locations and optional data, leaseline information, and target information. As to the preprocessor component 632, it may provide for assignment of target points, one or more optimizations, suggestions as to azimuth, template(s), where to use a single curve, a complex curve (e.g., multiple curves), etc. As an example, the pad sketcher system 600 may include different operational modes. For example, consider a mode whereby the preprocessor component 632 is bypassed such that input from the input block 631 is directed to the pad constraints component 634. As to the constraints component 634, it may provide for implementation of well constraints (e.g., surface location, targets, target lines) and dogleg severity (DLS or dls). As to the preferences block 635, it may provide for preferences such as J nudge, S nudge, 2D, 3D, single, multiple, etc., that can be utilized by the generator component 636, which may implement one or more techniques, optionally in a scenario or case-based manner.

Below, an example of code is provided for a pad sketcher constraint method.

```
public class PadSketchConstraint
{
public string CoordinateSystemName {get; set;}. "Default";
public string PadName {get; set;}. "Default";
public string Comment {get; set;}. " ";
public double Latitude {get; set;}=double.NaN;
public double Longtitude {get; set;}=double.NaN;
public double MinimumStartMD {get; set;}=0;
public List<PadWellConstraint> WellConstraints=new List<PadWellConstraint>( );
public double DefaultBuildDls {get; private set;}=double.NaN;
public double DefaultNudgeBuildDls {get; private set; }=double.NaN;
public double DefaultNudgeDropDls {get; private set; }=double.NaN;
}
```

Below, an example of code is provided for a pad well constraint method, which is called by the foregoing example code.

```
public class PadWellConstraint
{
public string WellName {get; set;}
public double NudgeBuildDls=double.NaN;
private double nudgeDropDls=double.NaN;
public double BuildDls=double.NaN;
public double NudgeKOPLimit {get; set;}=300; // special handling if want KOP at exact position.
public Station TieIn;
public double SurfaceLocationNS {get=>TieIn.NS; set=>TieIn.NS=value;}
public double SurfaceLocationEW {get=>TieIn.EW; set=>TieIn.EW=value;}
public double StartTVD {get=>TieIn.TVD; set=>TieIn.TVD=value;}
internal DO_Line TargetWithDirection1 {get; set;}
internal List<DO_Point> TargetPoints {get; private set; }=new List<DO_Point>( );
public double NudgeDropDls {get=>double.IsNaN(nudgeDropDls) ?NudgeBuildDls:
nudgeDropDls; set=>nudgeDropDls=value;}
public double TargetDls {get; internal set;}=MathLib.DEG_TO_RAD(2)/30.48;
```

Below, an example of code is provided for a preference method.

```
public class PadSketchPreferenceDTO
{
public string Shape {get; protected set;}
public List<string> Labels {get; set;} new List<string>( );
public string Name {get; set;
public eAlignTo AlignTo {get; set;}
public ConvexLeaseLine leaseLine {get; set;}
public PlaneDTO AlignToPlane {get; set;}
public eKickOff KickOffDistribution {get; set;}
public eBackToVertical BackToVerticalDistribution {get; set;}
```

```
public NudgeDistributionDTO NudgeDistributionRange
    {get; set;}
}
```
Below, an example of code is provided for a nudge distribution preference method.
```
public class NudgeDistributionDTO
{
public double NudgeStartMDRangeMin {get; set;}
public double NudgeStartMDRangeMax {get; set;}
public double InclinationRangeMin {get; set;}
public double InclinationRangeMax {get; set;}
public double AzimuthRangeMin {get; set;}
public double AzimuthRangeMax {get; set;}
}
```

As to a nudge as a portion of a trajectory, as an example, a system may provide for an S nudge using inclination, TVD, and KOP/KOP range, provide for a J nudge using KOP/KOP range and/or nudge to, toward, and/or away from a plane, normal to target line, to leaseline, a reference, etc. As an example, nudges can be part of an anti-collision approach that provides various anti-collision assurances for trajectories from a multiwell pad. As explained, nudges may be introduced in compliance with one or more constraints. As explained, a control point based geometric approach can be implemented rapidly to generate trajectories for a multiwell pad where nudges may be introduced using control points and/or points on a trajectory (e.g., a curve start or end point, a landing point, a kickoff point, etc.).

As explained, a template may provide an initial layout for trajectories, optionally with specifications, etc. As an example, a template may be selected using a database of templates and/or a customizable template. As an example, a trained ML model may provide for template selection and/or template generation (e.g., customization, etc.) based on input for a project (e.g., a multiwell pad). As an example, inputs can include slots and targets where a template can use such input for generation of trajectories, which may be visualized, for example, via a slot map, a target map, annotations and/or colors for mapped slot/targets, offset wells, options for display/no display of well name, tooltips hover features, trajectories with marks at particular stations (e.g., points on a trajectory). As an example, a station can be a point on a trajectory, which may correspond to a curve start point, a curve end point or another point. For a plan, a station can be a point where a survey is to be performed during drilling, which may utilize one or more types of tools (e.g., MWD, seismic, etc.). As an example, an output plan can include instructions associated with stations that can be utilized during drilling for taking one or more downhole surveys. For example, consider a digital plan that can be loaded into a drilling framework where instructions in the digital plan cause equipment to perform one or more actions, which can include drilling actions, survey actions, etc.

Figure 7:
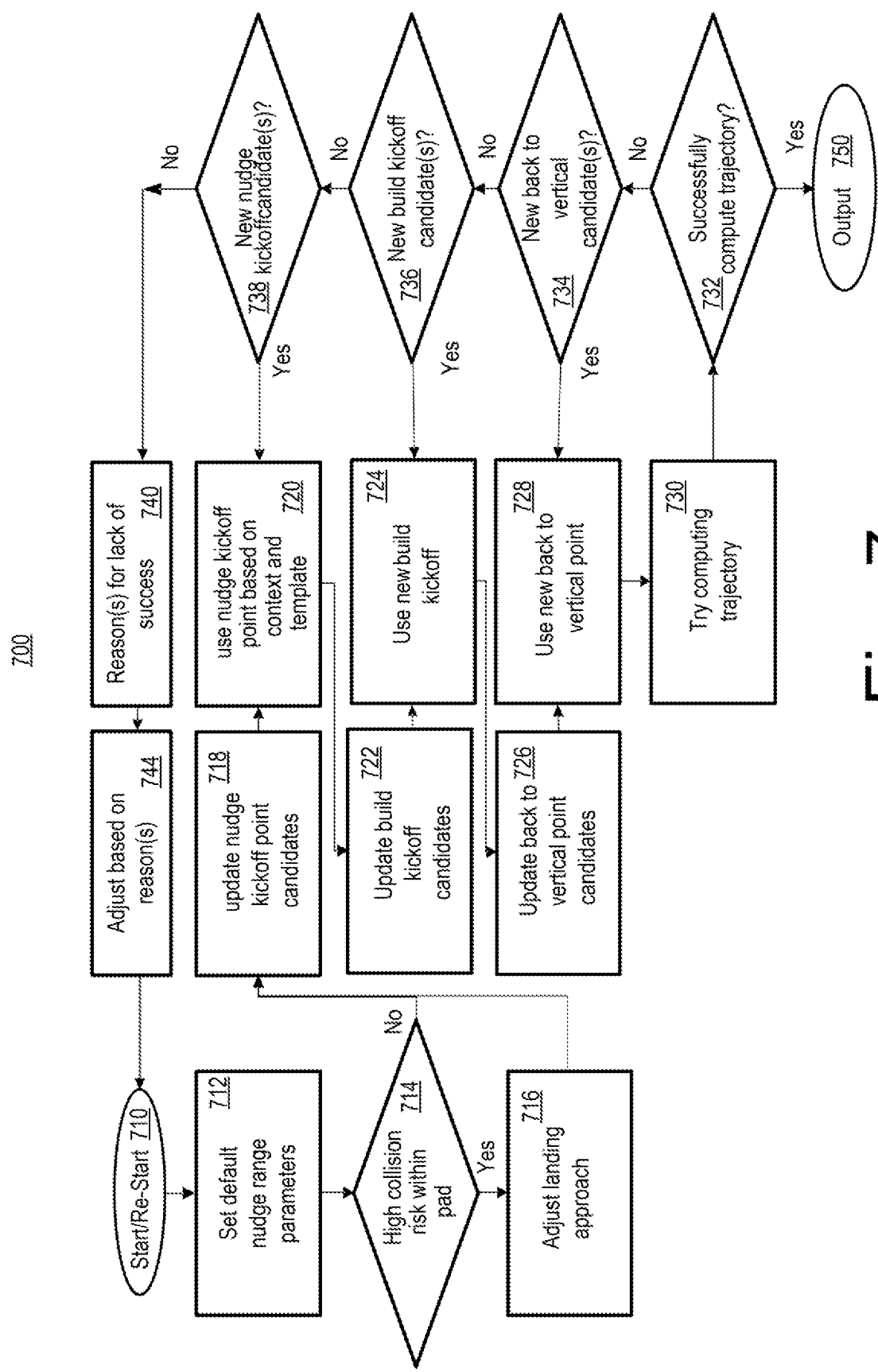
FIG. 7 shows an example of a method.

FIG. 7 shows an example of a method 700 that may be implemented by a system such as, for example, the pad sketcher system 600 of FIG. 6 (e.g., or the pad sketcher component 530 of the system 500). In the example of FIG. 7, the method 700 provide for generating a trajectory. As shown, the method 700 includes a start/re-start block 710, a set block 712 for setting default nudge range parameters, a decision block 714 for deciding whether a high collision risk exists for a pad (e.g., using one or more collision criteria), an adjustment block 716 for adjusting a landing approach (e.g., to reduce the collision risk), an update nudge block 718 for updating nudge kickoff point (nudge KOP) candidates, a use block 720 for using a nudge KOP based on context and a selected template, a update block 722 for updating build kickoff point (build KOP) candidates, a use block 724 for using a new build kickoff point, an update block 726 for updating back to vertical point candidates, a use block 728 for using a new back to vertical point candidate, and a try block 730 for trying to compute a trajectory for a well from the pad.

As shown, the method 700 includes a series of decision blocks 732, 734, 736 and 738 that can cause the method 700 to loop back to one or more of the blocks 720, 724 and 728. In particular, the decision block 732 decides whether the try block 730 has successfully computed the trajectory, where, if so, the method 700 can proceed to an output block 750 to output that trajectory. However, if the decision block 732 decides that the try block 730 is unsuccessful, then the method 700 can proceed to the decision block 734, which decides whether to determine a new back to vertical candidate or candidates. As shown, the decision block 736 pertains to one or more new build KOP candidates and the decision block 738 pertains to one or more new nudge KOP candidates. The decision block 734 can continue at the use block 728 and/or the update block 726, the decision block 736 can continue at the use block 724 and/or the update block 722, and the decision block 738 can continue at the use block 720 and/or the update block 718. In such an approach, the method 700 can utilize nudge kickoff, build kickoff and back to vertical point considerations to generate a trajectory, which can be assessed as to whether it is a successful trajectory or not.

As shown in the example of FIG. 7, a trajectory may be successful and output per the output block 750 or it may be unsuccessful for a well from a multiwell pad, for example, as indicated by a no branch from the decision block 738 (e.g., noting that one or more decision points may result in an indication of lack of success). In such an example, the method 700 can return to the start block 710 in a re-start where, for example, per a reason block 740 one or more reasons for lack of success (e.g., failure) may be determined and per an adjustment block 744 one or more adjustments may be determined for purposes of re-starting. For example, consider a geometric constraint that is violated by the unsuccessful trajectory. In such an example, a geometric nudge inclination constraint may have been limited to 30 degrees where a trajectory could at best demand 34 degrees. In a re-start, the method 700 can for a well that is not the first well go re-compute a trajectory for one or more prior wells. For example, consider an unsuccessful trajectory as being for a third well of a multiwell pad where the adjustment block 744 can indicate that an adjustment to the trajectory for a neighboring second well of the multiwell pad is to be adjusted as to its nudge inclination and/or one or more other aspects and/or the trajectory for a first well of the multiwell pad is to be adjusted as to its nudge inclination and/or one or more other aspects. In such an approach, trajectories can be automatically generated for wells from a multiwell pad in an automated manner or, for example, with some amount of user interaction (e.g., to review a reason lack of success, to review a recommended adjustment, to make an adjustment, etc.). As explained, a control point based approach to trajectory generation can expedite planning of trajectories for a multiwell pad.

Figure 8:
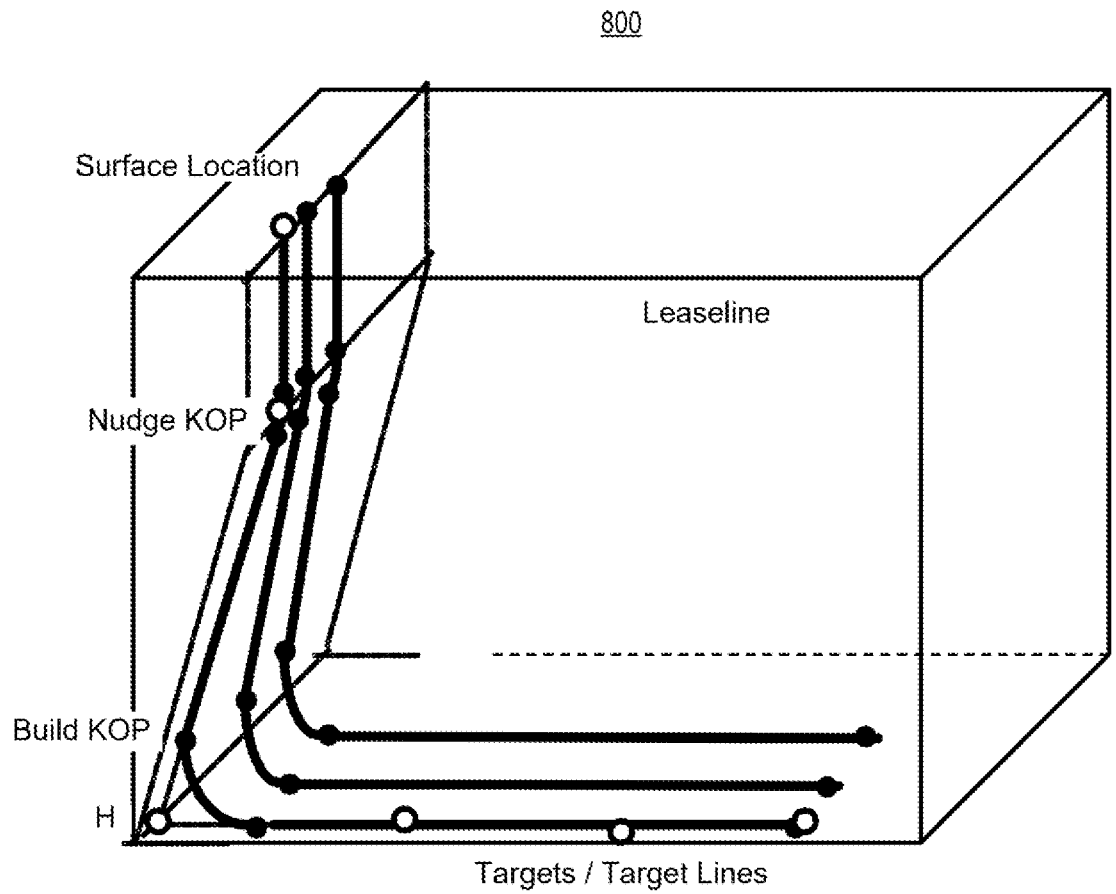
FIG. 8 shows an example of a diagram of a multiwell pad.

FIG. 8 shows an example diagram 800 of three well trajectories as extending from surface locations to targets or target lines. As an example, a system that includes pad sketcher features may be utilized to generate the trajectories shown in FIG. 8. As an example, a pad sketcher component may implement a minimum curvature technique. For example, consider use of minimum curvature to design each trajectory based on "key points" (control points), which may not lie perfectly on the trajectory but have determining influence on the trajectory shape. In one embodiment, key points include two types of key points, a joint point and a curve start point. In such an example, the joint point may not be along the trajectory while the latter one, the curve start point, will be on the trajectory. As an example, a joint point can be a point that is not on a trajectory and that is utilized for determining a curve that includes a curve start point on a trajectory and a curve end point on the trajectory. As an example, a joint point may be labeled "O" whereas other types of control points may be labeled "P" (e.g., P1 or P2). As to a curve start point, it may be labeled "A" while a curve end point may be labeled "B". In various examples, control points may be labeled O, P, A or B, as appropriate for a portion of a trajectory being designed (e.g., according to case type, etc.). As an example, position of a control point can be specified or position of a control point can be computed. As an example, known inputs for wells may be assumed to include surface location, target line, additional targets, dogleg severity values, nudge to position reference, and nudge kickoff measured depth (MD).

As an example, a method may include extending to target line along a backward direction to intersect a nudge to position reference to define the nudge to position. Such an approach may optionally be skipped by giving a fix nudge to position. In the diagram 800 of FIG. 8, the nudge to position is shown as H and is set as a joint point (e.g., a type of control point that is not on a trajectory). In such an example, the method can include defining a nudge KOP based on a surface location and a nudge kickoff depth (e.g., measured depth (MD)) and setting a curve start nudge KOP here and computing its position as a control point. In such an example, the method can include using straight lines to connect various points together (e.g., the surface location as the joint type, the nudge KOP as the curve start type, the point H as a joint type, and all targets as the curve start type) to compute build kickoff as a control point. In such an example, the method can include computing one or more stations along the trajectory, for example, based on a minimum curvature technique, including measured depth (MD), inclination (incl), azimuth (azi), and dogleg severity (DLS or dls).

In FIG. 8, various example procedures are listed, which, for example, may be defined by a pad template. As shown, the procedures can include an order of procedures such as calculate key point H, calculate nudge KOP, calculate build KOP and calculate each station.

Figure 9:
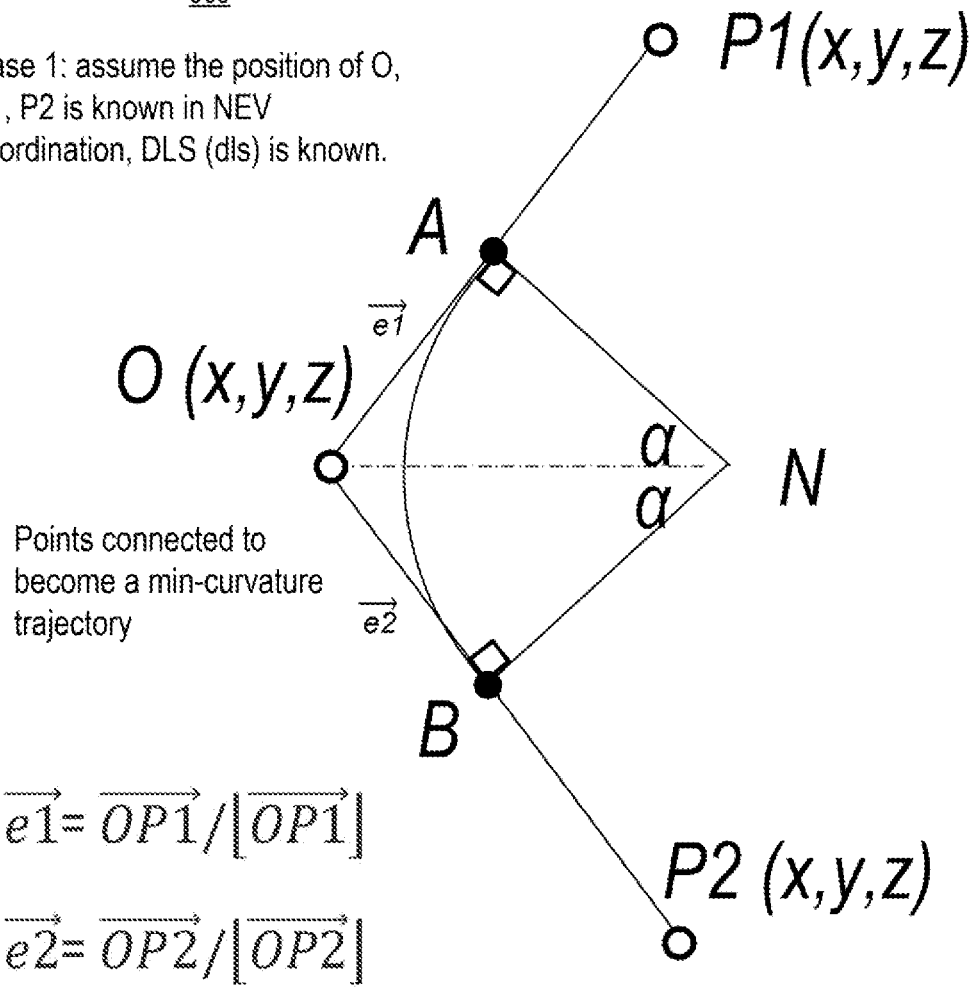
FIG. 9 shows an example of a technique.
Figure 10:
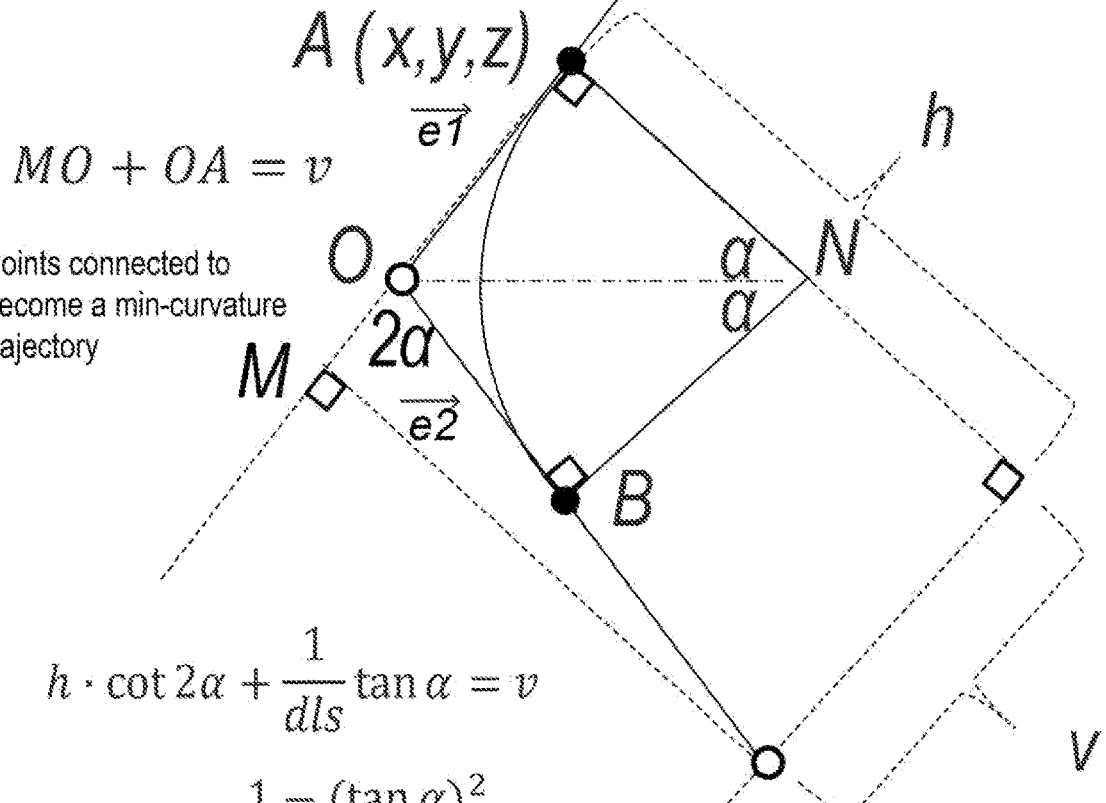
FIG. 10 shows an example of a technique.

FIG. 9 shows an example of a technique 900, referred to as Case 1, and FIG. 10 shows an example of a technique 1000, referred to as Case 2. The example techniques 900 and 1000 may be implemented by a pad sketcher component and/or system. As mentioned, a technique may employ a curve minimization.

As shown in FIG. 9 and FIG. 10, one or more of the techniques 900 and 1000 may be employed as a control point technique for a joint point, O, and a curve start point, A. For example, consider input of previous, current and latter points positions, where the design station along the trajectory can be setup as the beginning and ending point of a filter curve between the two adjacent straight-line sections. In such an example, moving a control point can lead to a relatively intuitive change in trajectory shape. Such an approach can enable an efficient optimization approach to multi-trajectories design (e.g., consider the method 700 of FIG. 7)

In the example technique 900 of FIG. 9, referred to as Case 1, two adjacent straight-line sections, which are vectors, are shown, labeled as $\vec{e1}$ and $\vec{e2}$. These two sections can provide a basis from which a curve can be computed. As shown, the section $\vec{e1}$ can be defined as a unit vector from the point O and aiming at the point P1 while the section $\vec{e2}$ can be defined as a unit vector from the point O and aiming at the point P2. As indicated, a method can include assuming that the positions of points O, P1 and P2 are known in NEV coordinates (e.g., northing, easting and vertical) and that DLS (dls) is known (e.g., optionally specified according to one or more equipment capabilities, formation characteristics, etc.). In such an example, a curve between points A and B can be determined, where the measured depth (MD), inclination and azimuth may be determined for points A and B. Thus, the technique 900 can be utilized to connect points for a minimum curvature portion of a trajectory. In the example technique 900, the points O, P1 and P2 can be geometric points (e.g., control points) that are utilized to determine one or more points on a trajectory (e.g., that define in part a trajectory) where the points O, P1 and P2 are not necessarily restricted to being on the trajectory (e.g., one or more of the points O, P1 and P2 may be a distance from a trajectory being designed). As explained, where a trajectory does not satisfy one or more criteria, an iterative approach may be taken, which can involve adjusting one or more control points (see, e.g., the method 700 of FIG. 7). Such an approach can be part of a multiwell pad design framework that can generate trajectories for the multiwell pad with anti-collision assurances and/or one or more drilling related assurances (e.g., HKLD, STOR, sticking risk, borehole integrity, etc.).

In the example technique 1000 of FIG. 10, referred to as Case 2, two adjacent straight-line sections are also shown, however, in Case 2, it is assumed that the positions of A (curve start point), P1 and P2 are known in NEV coordinates, along with DLS (dls). In such an example, the position of the point O (joint point) may be determined, and hence, the position of the point B. Thus, the technique 1000 can be utilized to connect points for a minimum curvature portion of a trajectory using specified control points.

In the examples of FIG. 9 and FIG. 10, the points A and B are on a trajectory, while the points O, P1 and P2 are geometric and not necessarily on the trajectory. As to the technique 1000 (Case 2), it can include specifying where a curve is to commence (e.g., curve start point), which is shown as point A, while the point B is determined as a point where the curve ends (e.g., curve end point). While a minimum curvature approach can be implemented, one or more other approaches may be utilized. In various examples, a task can be to find a control point or control points to control a trajectory, where a control point is not necessarily on the trajectory. In such an approach, control points can be determined for rapid trajectory generation.

As an example, one or more techniques may employ one or more types of continuity, which can be employed as one or more continuity constraints. For example, consider G0 geometric continuity where two curve segments join together; G1 geometric continuity where the direction of the two segments' tangent vectors are equal at the join point; C0 continuity where curves share the same point where they join; C1 continuity where tangent vectors of the two segments are equal in magnitude and direction (share the same parametric derivatives); and C2 continuity where curves share the same parametric second derivatives where they join. As an example, a technique may employ one or more of interpolation and approximation.

While minimum curvature is given as an example, one or more other techniques may be employed. For example, consider a balanced tangential technique, an average angle technique, a radius of curvature technique, a mercury technique (e.g., a modified balanced tangential technique), etc. As an example, a technique can be utilized that aims to generate a curve that is smooth. As an example, a Hermite cubic technique may be utilized where a curve is defined by its two endpoints and tangent vectors at endpoints. A set of Hermite curves can have the same values for the endpoints and tangent vectors of the same direction, but with different magnitudes for one of the tangent vectors while the magnitude of the other tangent vector may remain fixed. The minimum curvature technique, akin to the radius of curvature technique, takes the space vectors defined by inclination and direction measurements and smooths these onto a trajectory curve by the use of a ratio factor which can be defined by curvature (dogleg) of the trajectory section. The minimum curvature technique can produce a circular arc as does the radius of curvature technique. This is not, however, an assumption of the technique, but a result of minimizing the total curvature within the physical constraints on a section of trajectory. The minimum curvature technique is a computational technique that is implemented using a processor and instructions stored in memory that are executable by the processor (e.g., consider a pad sketcher component implementation). As an example, a curve can be curved in multiple dimensions (e.g., horizontal plane and/or vertical plane). As an example, a curve may be defined using a change in depth, a change in northing and a change in easting in NEV coordinates.

As explained, through use of control points, appropriate, constraint-based, safe directions for nudges can be determined. For example, consider an approach that can include moving one or more control points, which may generate results more efficiently than moving one or more points that are directly on (e.g., part of) a trajectory. For example, consider an approach that involves moving a control point in a particular direction (e.g., depth, east, north, etc.) by a desired distance (e.g., one meter, ten meters, etc.) whereby a trajectory can be rapidly generated in a manner that takes into consideration various constraints. Such an approach may be more intuitive for a user than trying to reshape a trajectory through adjustments to individual points directly on the trajectory.

As an example, a method can include generating trajectories for wells from a pad where the method involves use of control points. In such an example, inclination and azimuth may be restricted spatially in one or more regions while some flexibility is built into to rapidly construct multiple trajectories that meet various constraints, which can include anti-collision constraints.

Referring again to diagram 800 of FIG. 8, various points can be related to scenarios such as, for example, the Case 1 of FIG. 9 or the Case 2 of FIG. 10. In the diagram 800, various points do not necessarily lie on one or more of the trajectories. For example, the point H is shown as a point that is not on a trajectory. As an example, the point H can be a control point (e.g., a geometric point) that facilitates determination of one or more points that are on a trajectory. As an example, the point H may correspond to a leaseline such as, for example, a back boundary leaseline, which can intersect a target line. In the diagram 800, each of the trajectories may be defined by a number of curves such as, for example, a curve associated with a KOP and a curve associated with a build section. As shown, the trajectories are substantially vertical and then curve backwards from which they continue along straight lines until their respective build sections. After the build sections, each of the trajectories continues along a target line. As explained, through a control point approach, each of the trajectories can be generated relatively rapidly while meeting various constraints, which can include anti-collision constraints.

As an example, the Case 1 technique 900 of FIG. 9 may be implemented for determining a build KOP such as, for example, one or more of the build KOPs shown in the diagram 800 of FIG. 8. As explained, a control point (e.g., a key point) may be defined using one or more geometric constraints such as a leaseline and a target line where the control point may be at an intersection thereof. For example, consider the point H in the diagram 800 as being the point O in the Case 1 technique 900 of FIG. 9 where an upper open circle is P1 (e.g., near the nudge KOP) and where another open circle possibly along a target line is P2. In such an approach, the filled circles can be the circles A and B that are on the trajectory and define a curve start point and a curve end point where the curve between them comports with one or more DLS (dls) related constraints.

As an example, the Case 2 technique 1000 of FIG. 10 may be implemented for determining a nudge KOP such as, for example, one or more of the nudge KOPs shown in the diagram 800 of FIG. 8. In such an example, a depth may be given for the nudge KOP as an input, that may optionally act as a constraint. With reference to FIG. 10, the depth for the nudge KOP may correspond to the point A as a curve start point, which has an assumed known position, and where the surface location can be the point P1 and where the point H may be the point P2, whereby a pad sketcher component or system can determine a location of a control point (e.g., the point O) and consequently the point B, as a curve end point.

As explained, a system can include multiple techniques for determining one or more curved portions of a trajectory in a relatively rapid manner through use of one or more control points, noting that a trajectory can be composed on multiple curves and holds (e.g., straight-line portions). Such an approach can facilitate designing plans for multiwell pads, particularly where risks of collision exist and are to be minimized.

Figure 11:
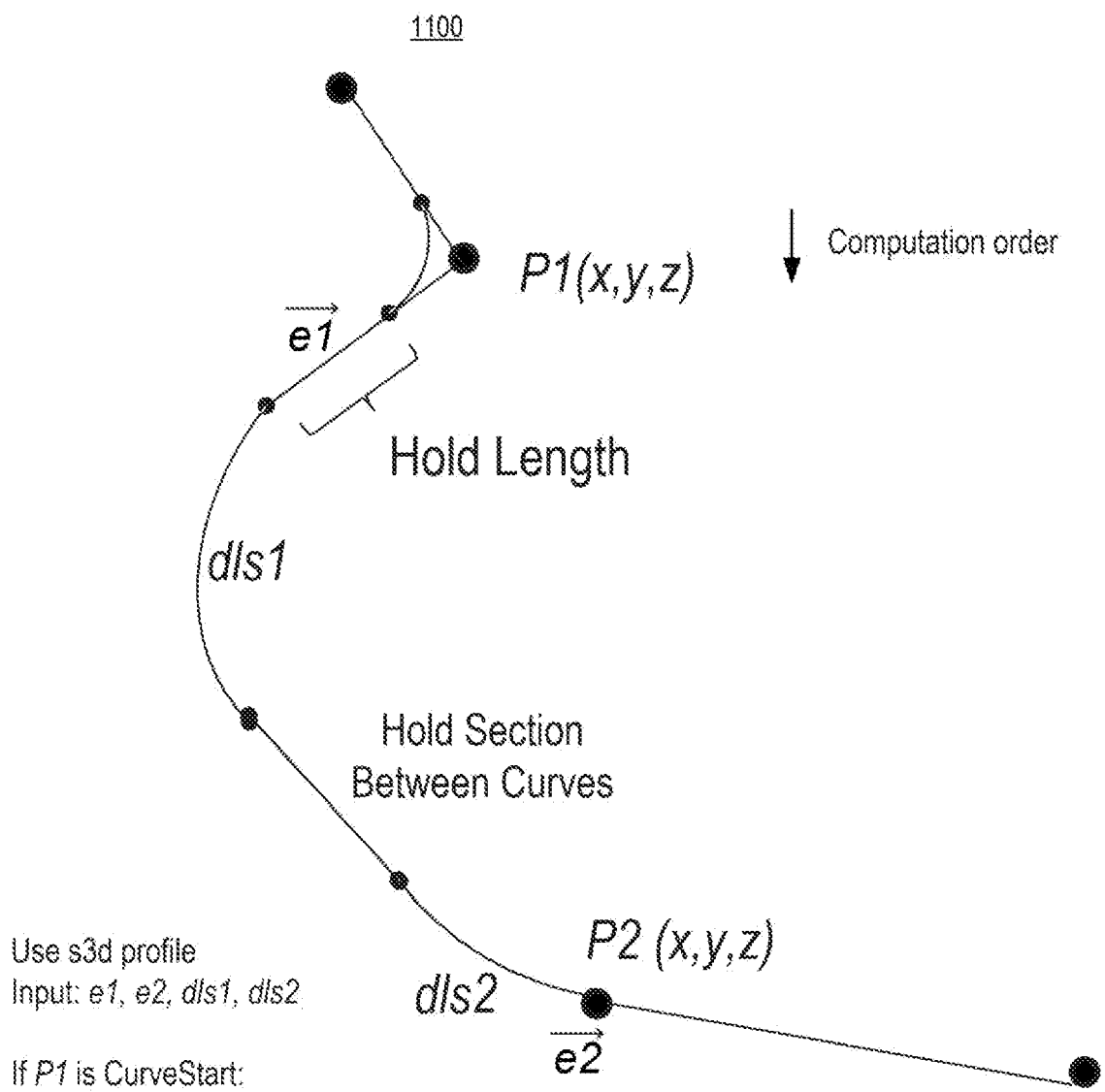
FIG. 11 shows an example of a technique.

FIG. 11 shows an example of a technique 1100 where two curves may be determined, for example, using one or more DLS (dls) constraints and a minimization of curvature technique (e.g., for each curve or for both curves). The technique 1100 can be implemented using hold length, $\vec{e1}$, $\vec{e2}$, dls1, and dls2 as input, with respect to control points P1 and P2 with known NEV positions. The direction of P1 is $\vec{e1}$, and the direction of P2 is $\vec{e2}$. The two curves can be determined via corresponding points where a hold section can exist between the two curves. In the example of FIG. 11, the technique 1100 can be implemented using the hold length in a direction of a unit vector $\vec{e1}$ after a curve referenced with respect to the control point P1, where P2 is adjacent to the other vector $\vec{e2}$. As shown, the hold length is the length between the end point of previous curve along the trajectory and the starting point of a current section's first curve, where the hold length is defined as a straight segment along the trajectory. In the example of FIG. 11, as shown, two curves are determined via corresponding points where a straight-line section (hold section) can exist between the two curves.

As shown, one curve may have an associated DLS labeled dls1 while the other curve may have an associated DLS labeled dls2. As an example, the technique 1100 may be a multidimensional technique (e.g., 3D) that includes inputs for $\vec{e1}$, $\vec{e2}$, dls1 and dls2. As shown, two different scenarios may exist where P1 can be either a curve start point (curve start type), which may not necessitate input of $\vec{e1}$, or a joint point (joint type), where $\vec{e1}$ is used to compute the P1 curve's end point and where that end point can be used as a tie-in point. As an example, where P1 is a curve start point, an associated vector may not be specified as an input. For example, a technique can include $\vec{e2}$, dls1 and dls2 as input where P1 is a curve start point (e.g., consider moving P1 to the curve start point for the curve associated with dls1, which may make the point P1 akin to the point A in Case 2: In such an example, the technique can use P1 input position as a tie-in for the curve directly after P1. In such an example, the hold length is not utilized while there may still be a hold section between the curves associated with dls1 and dls2.

As an example, a method can optionally include re-planning during field operations such as drilling. For example, consider drilling a first well from a multiwell pad where an obstacle may be encountered and mapped. In such an example, a system such as the system 500 of FIG. 5 may be utilized to re-plan the trajectory and/or one or more other trajectories from the pad. Such an approach may be implemented in a relatively rapid manner that reduces non-productive time (NPT).

As explained, a template can be a pad template that may define initial characteristics of trajectory profiles and how to generate them. In one embodiment, the pad template may be originated from data analysis from existing trajectories (e.g., trajectories within the pad), noting that source or sources are not limited to pad trajectories or real-world trajectories. As explained, one or more machine learning approaches can be implemented for trajectory design for templates. As an example, a pad template may be extracted manually with human experience. As an example, pad templates may be summarized with automated data analysis techniques.

In one embodiment, a template defines a profile for a vertical segment (e.g., a nudge segment), build segment, landing segment and target segment or others. As a simple example, a pad template can be: S nudge kick off at MD1, nudge inclination of a, go back to vertical at true vertical depth of TVD1, single-curve or curve-curve landing onto the first given target.

As an example, pad templates can embed some domain knowledge to prevent unreasonable trajectories. For example, a pad template may be configured to avoid snaking trajectory design within a segment or trajectories, to check if two targets belonging to different trajectories are too close to each other, or to adjust the template when collision-free trajectories are not possible for the given input with or without nearby offset wells or designs.

As an example, pad templates may be used for one or more offset well analysis technique, for example, to recommend a proper pad template for new input with or without optional setup. In one embodiment, input can be surface locations and targets, possibly without customization about whether S nudge or J nudge are to be used, where to kickoff the nudge and/or where to build and landing. Pad templates may be configured to reasonable default setup based on historical data, like an existing pad pattern proximate to its location, the user or client habits. As an example, logic can involve a pad template extraction process, design purpose, etc.

In one embodiment, an evaluator executes strict or simplified engineering analysis to evaluate output trajectories from multiple perspectives. An evaluator can facilitate engineering decisions for engineers or further automatic decision system. As an example, evaluation indexes can be the same as or different from optimizer objectives. As an example, geometrical characteristics can be utilized to facilitate user assessment and, if appropriate, user adjustment to a trajectory shape. Evaluation indexes may include single trajectory like ERD, tortuosity, or multiple trajectories like anti-collision minimum allowable separation distance or evaluated against other existing wells or external well plans.

In one embodiment, an evaluator is configured to achieve reasonable accuracy under practical user cases. Because trajectory design can be the first step during the whole well planning process, the detailed calculation setup for some evaluation indexes may not be ready. For example, BHA information may be unknown when evaluating torque and drag index at very early stage. In such a case, either default BHA design (predefined or recommended with some intelligent algorithm based on offset well or historical data analysis) can be used for rough evaluation or simply omitted from the evaluation.

Figure 12:
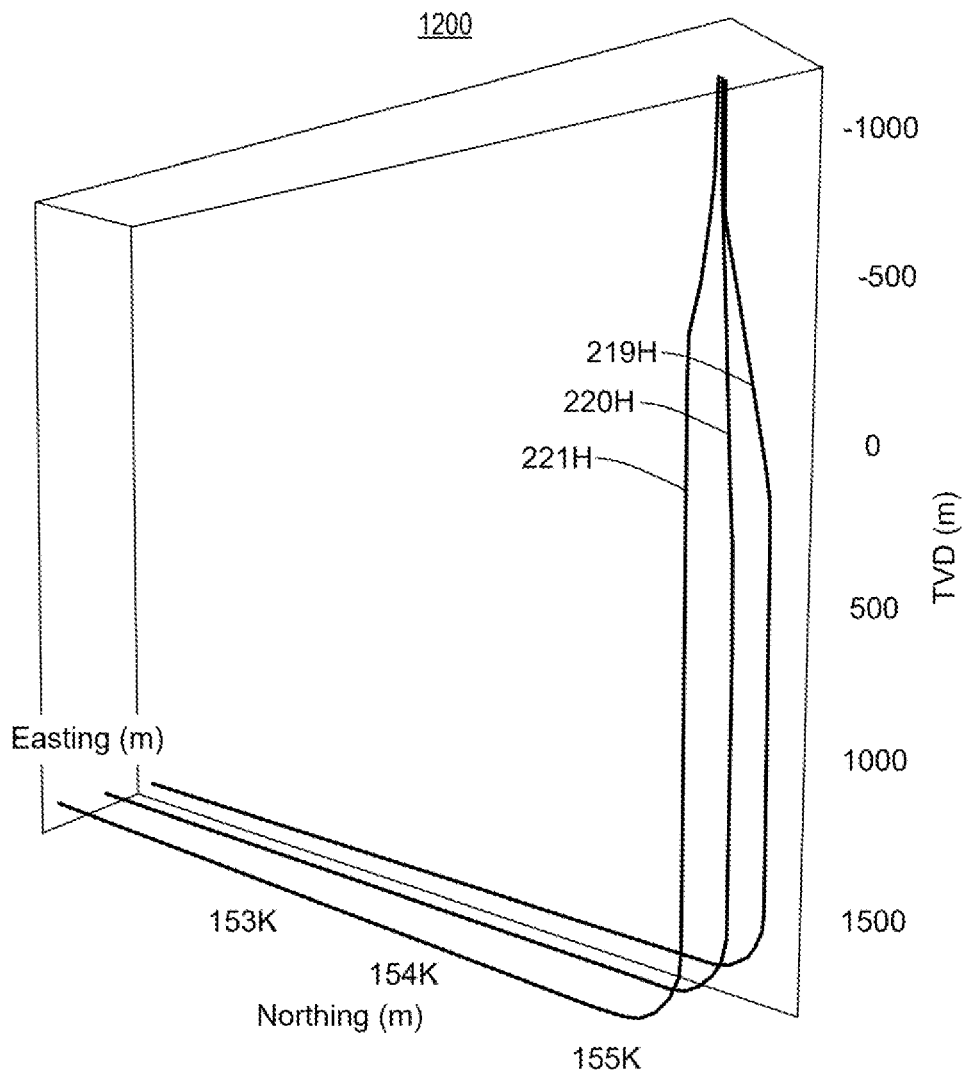
FIG. 12 shows an example of a graphical user interface.

FIG. 12 shows an example of a visualization 1200 of output where trajectories for three wells are shown in a 3D space with coordinates and where a table is also show that includes various information, which can include KPIs as generated by a system as part of multiwell pad trajectory generation. In the table, the names of each of the wells are present along with various geometric information and drilling related information. As to the drilling related information, it includes, for example, hook load (HKLD) and surface torque (STOR), which may be computed for one or more positions along a trajectory and utilized during drilling. As explained, such information may be utilized during actual drilling to make one or more decisions as to whether to proceed, whether risk is increasing or decreasing, whether to re-plan one or more of the trajectories, etc. As an example, the visualization 1200 can be a graphical user interface (GUI) that allows for user interactions, which may include making one or more adjustments to one or more of the trajectories, which may automatically trigger a return to a pad sketcher component.

As an example, an optimizer can adjust editable parameters for different pad templates, aiming at achieving an "optimal" solution under given inputs and constraints. Using the example discussed above with respect to pad templates, consider S nudge kick off at MD1, nudge inclination of a, go back to vertical at true vertical depth of TVD1, single-curve or curve-curve (CC) landing onto the first given target. In such an example, the value of MD1, TVD1, a, single-curve or curve-curve (CC) can be editable parameters. In such an example, changing these parameters will lead to different KPIs (see, e.g., the table of FIG. 12). Optimized results can be achieved through one or more optimization techniques (e.g., domain-specific optimization, multi-objective particle swarm optimization (MOPSO), multi-objective genetic algorithm (MOGA), non-dominated sorting genetic algorithm (NSGA(-II)), etc.).

As an example, an optimization objective and constraint can be transformed into each other in some cases. For example, anti-collision index separation factor can be either an objective to maximize or handled as a constraint that is not to be smaller than a specific value. As an example, one or more KPIs and constraints can be pre-defined and/or be configured for each user case.

As an example, a system can provide for one or more instances and/or types of manual intervention. For example, through use of one or more GUIs, a user may intervene at one or more different points inside or outside an automated pad trajectory design workflow.

FIG. 13 shows an example of a GUI 1300 that can provide for user interaction. For example, consider a workflow using a system that can operate in an automated mode and/or in a semi-automated mode. In such an example, the GUI 1300 may be rendered to a display such that a user can review, edit, enter, etc., information for a well, which may be on a well-by-well basis for a multiwell pad. As shown, the GUI 1300 includes information for slot layout, including pad center position, row, row spacing, column, column spacing and rotation. As shown, the GUI 1300 can include information for targets, including one or more targets and/or one or more target lines. As an example, an advanced setup option may be available, along with a control graphic to cause the system to generate a pad with trajectories. In such an example, once the control graphic is actuated, the workflow can continue to completion, optionally with rendering of one or more GUIs that can provide for additional interaction.

Figure 14:
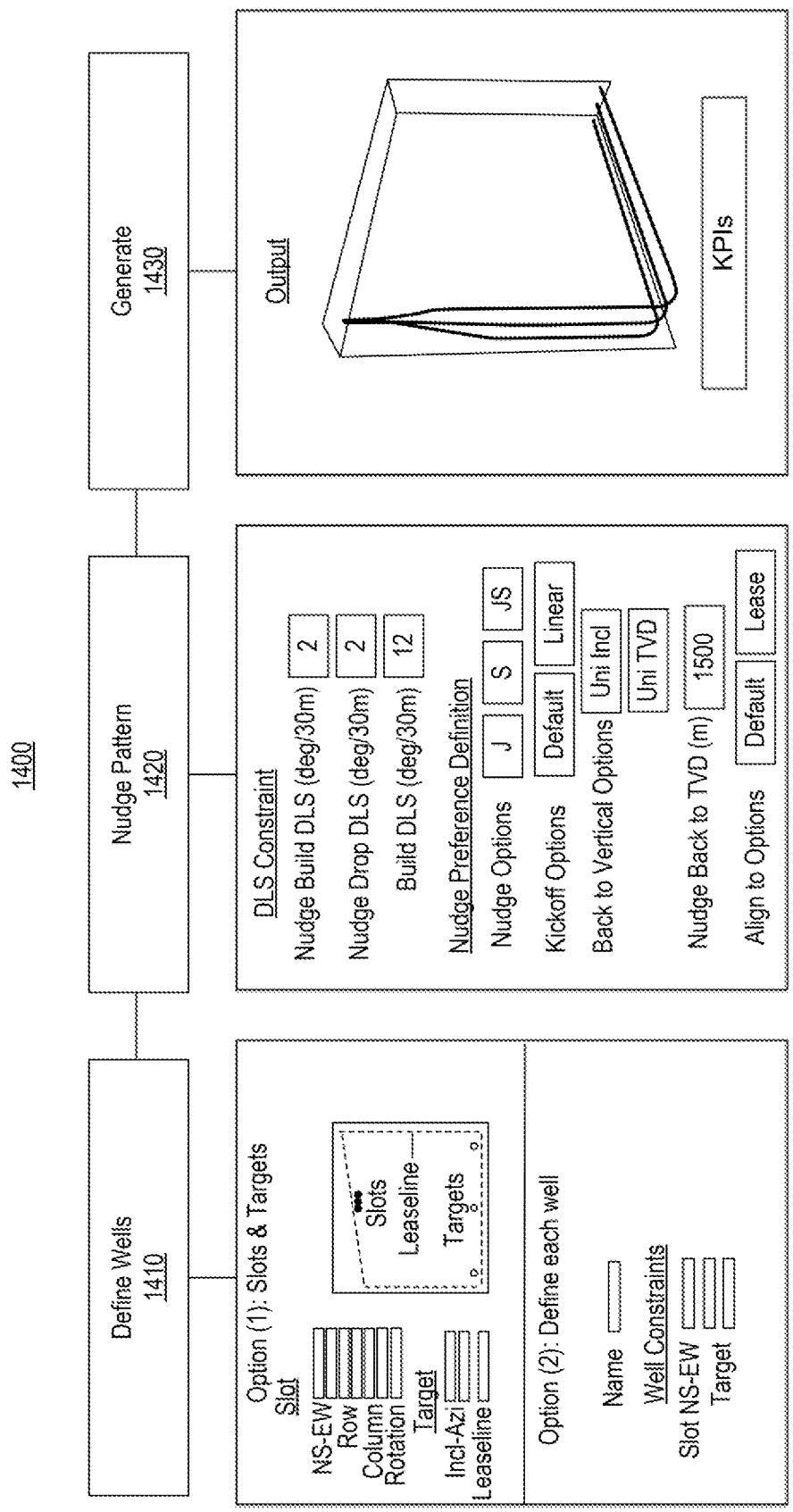
FIG. 14 shows an example of a method and examples of graphical user interfaces.

FIG. 14 shows an example of a method 1400 that includes a definition block 1410 for defining wells, a nudge pattern block 1420 for defining nudge patterns, and a generation block 1430 for generating output. In the example of FIG. 14, the method 1400 may operate in a semi-automated mode of a system. For example, in a semi-automated mode, a user can input information regarding slots, targets, leaselines, etc. and/or input information for individual wells. As shown, one option may be referred to as a slots and targets approach and another option may be referred to as a define each well approach. As to the nudge pattern block 1420, a GUI may be rendered to a display that allows for review, editing, input, etc., of nudge related information, which can include nudge build DLS, nudge drop DLS, build DLS, etc. As shown, various nudge preferences for a multiwell pad may be specified, including, for example, J nudge, S nudge and/or J and S nudge, along with kickoff options, back to vertical options, nudge by to TVD distance, and one or more alignment options. As to the output of the generation block 1430, it can include rendering a GUI for visualization of information, for example, as explained with respect to the visualization 1200 of FIG. 12, which can include spatial information along with tabulated information that can relate to optimization (e.g., KPI optimization, etc.).

In one embodiment, inside a workflow, manual intervention can be realized through optional input data. If a user has no information to provide the optional data, pad trajectory design workflow may define the optional data based on the combination or input data analysis, data analysis from database or more detailed offset well analysis with inner logic. However, if a user has enough information, the user can setup more details to generate the trajectories. As an example, intervention may occur after generation of a first draft with mandatory input where output KPI from an evaluator provides sufficient data for the user to adjust the optional data, and thus refine the trajectories based on the output within the pad trajectory design workflow.

As an example, a system may interact with one or more other applications, frameworks, systems, etc., to adjust trajectory geometry. For example, an output trajectory can be transformed into a specific format or data structure which can be modified with other applications. As an example, output from a system may be introduced to a simulator that may be a drilling simulator, a wellbore geomechanics simulator, a reservoir simulator, a stimulation simulator, etc. In such an example, one or more of multiple trajectories from a pad sketcher system can be subject to rigorous analysis, which may provide for generation of feedback that can be implemented in another round of trajectory generation, for example, to refine one or more trajectories to meet certain goals, to optimize production, to minimize NPT, etc. As an example, consider a reservoir simulation where drainage from a reservoir may be less than expected such that spacing of targets may be adjusted in an effort to increase production from a gang of wells stemming from a common pad. As another example, consider a drilling simulator that indicates one BHA can perform drilling more efficiently than another BHA, however, that a DLS criterion may differ for the two BHAs. In such an example, a pad sketcher system may be executed to generate trajectories for the more efficient BHA, where results from the two may be evaluated (e.g., using KPIs, additional simulations, etc.), to arrive at a final plan.

As an example, apart from manual input and various types of information computed within a pad trajectory design workflow, optional input data can also come from one or more other sources, for example, from an input recommendation service to define a quite detailed setup for a whole pad and/or for each well.

As an example, pad trajectory design can be integrated with one or more other applications such as, for example, single trajectory design, re-plan while drilling and even formation interpretation.

As an example, pad trajectory design can integrate with one or more single trajectory design workflows. As an example, consider an approach that converts output trajectories from pad design to trajectory design input and uses trajectory design tools to generate a group of trajectory candidates within a range, where one or more users can explore solutions and select the best one according to their engineering constraint and experience.

As an example, pad trajectory design can be integrated into one or more while-drilling processes to monitor one or more as-drilled trajectories and to assist with one or more re-planning processes, for example, when a deviation from plan is too large (e.g., according to one or more criteria). As an example, pad trajectory design can be integrated into a formation interpretation framework, for example, to combine geological target definition process and pad trajectory design process. In such an example, lithology information may be utilized, which may be from one or more pilot wells, offset wells, seismic survey analyses, etc. In such an approach, drilling mechanics may be taken into account, for example, to reduce drilling distances in one or more type of materials, etc., which may expedite drilling, provide for improved borehole integrity, etc.

Figure 15:
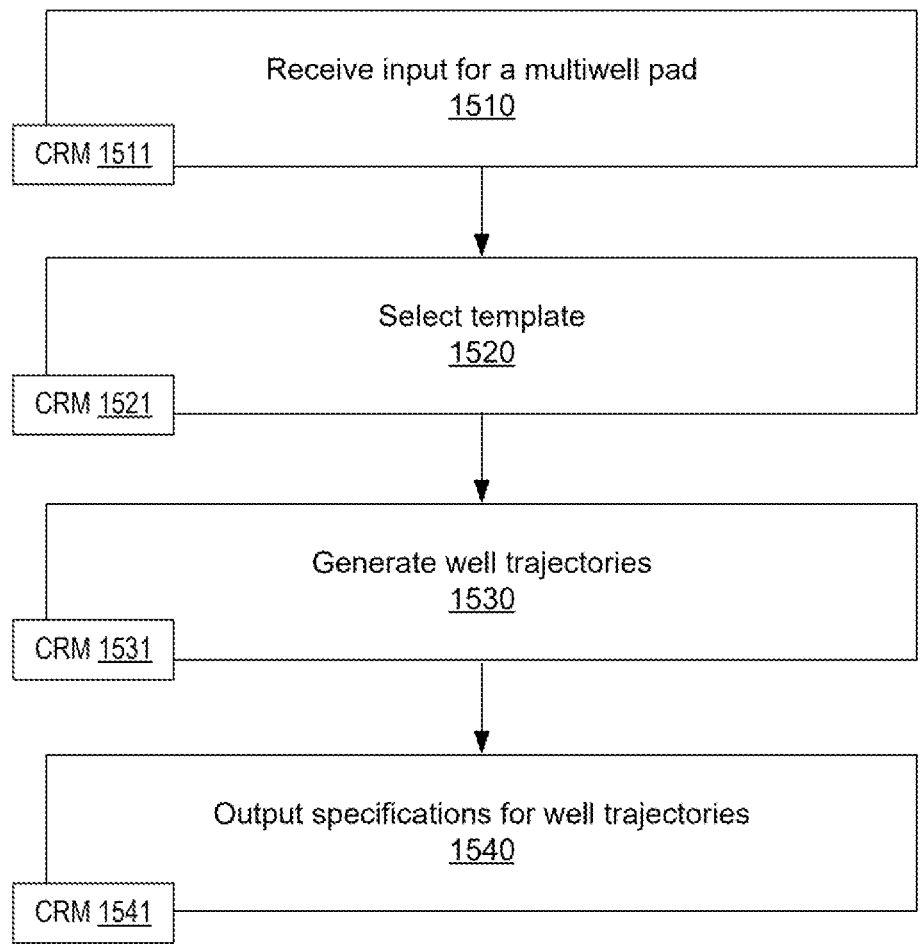
FIG. 15 shows an example of a method and an example of a system.
Figure 15:
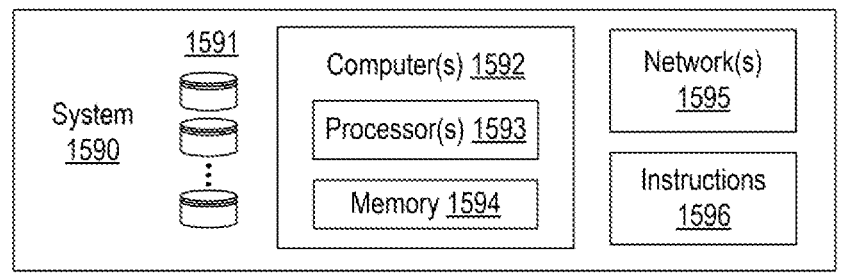

FIG. 15 shows an example of a method 1500 and an example of a system 1590. As shown, the method 1500 can include a reception block 1510 for receiving input for a multiwell pad; a selection block 1520 for selecting, based at least in part on a portion of the input, a template for the multiwell pad; a generation block 1530 for generating, based at least in part on the template, well trajectories for the multiwell pad, where each of the well trajectories extends from a surface location of the multiwell pad to one or more reservoir target locations and where each of the well trajectories includes at least one curve generated using one or more dogleg severity values and one or more geometric control points that are not required to lie on one or more of the well trajectories; and an output block 1540 for outputting specifications for the generated trajectories of the multiwell pad.

FIG. 15 also shows various computer-readable media (CRM) blocks 1511, 1521, 1531, and 1541. Such blocks can include instructions that are executable by one or more processors, which can be one or more processors of a computational framework, a system, a computer, etc. A computer-readable medium can be a computer-readable storage medium that is not a signal, not a carrier wave and that is non-transitory. For example, a computer-readable medium can be a physical memory component that can store information in a digital format.

In the example of FIG. 15, a system 1590 includes one or more information storage devices 1591, one or more computers 1592, one or more networks 1595 and instructions 1596. As to the one or more computers 1592, each computer may include one or more processors (e.g., or processing cores) 1593 and memory 1594 for storing the instructions 1596, for example, executable by at least one of the one or more processors. As an example, a computer may include one or more network interfaces (e.g., wired or wireless), one or more graphics cards, a display interface (e.g., wired or wireless), etc. The system 1590 can be specially configured to perform one or more portions of the method 1500 of FIG. 15.

As an example, a computational framework can include a solver, which may be implemented via executable instructions. For example, consider a computational framework that includes a processor and memory accessible to the processor where executable instructions can be stored in the memory and accessed for execution by the processor to cause the computational framework to perform one or more actions. Such a computational framework can include one or more interfaces for receipt of information and/or for output of information, which can include values of parameters, an instruction, etc. As an example, a computational framework may be part of a controller. As an example, a computational framework may be part of a system.

As an example, various systems, methods, etc., can implement one or more ML models. As to types of ML models, consider one or more of a support vector machine (SVM) model, a k-nearest neighbors (KNN) model, an ensemble classifier model, a neural network (NN) model, etc. As an example, a machine learning model can be a deep learning model (e.g., deep Boltzmann machine, deep belief network, convolutional neural network, stacked auto-encoder, etc.), an ensemble model (e.g., random forest, gradient boosting machine, bootstrapped aggregation, AdaBoost, stacked generalization, gradient boosted regression tree, etc.), a neural network model (e.g., radial basis function network, perceptron, back-propagation, Hopfield network, etc.), a regularization model (e.g., ridge regression, least absolute shrinkage and selection operator, elastic net, least angle regression), a rule system model (e.g., cubist, one rule, zero rule, repeated incremental pruning to produce error reduction), a regression model (e.g., linear regression, ordinary least squares regression, stepwise regression, multivariate adaptive regression splines, locally estimated scatterplot smoothing, logistic regression, etc.), a Bayesian model (e.g., naïve Bayes, average on-dependence estimators, Bayesian belief network, Gaussian naïve Bayes, multinomial naïve Bayes, Bayesian network), a decision tree model (e.g., classification and regression tree, iterative dichotomiser 3, C4.5, C5.0, chi-squared automatic interaction detection, decision stump, conditional decision tree, M5), a dimensionality reduction model (e.g., principal component analysis, partial least squares regression, Sammon mapping, multidimensional scaling, projection pursuit, principal component regression, partial least squares discriminant analysis, mixture discriminant analysis, quadratic discriminant analysis, regularized discriminant analysis, flexible discriminant analysis, linear discriminant analysis, etc.), an instance model (e.g., k-nearest neighbor, learning vector quantization, self-organizing map, locally weighted learning, etc.), a clustering model (e.g., k-means, k-medians, expectation maximization, hierarchical clustering, etc.), etc.

As an example, a system may utilize one or more recurrent neural networks (RNNs). One type of RNN is referred to as long short-term memory (LSTM), which can be a unit or component (e.g., of one or more units) that can be in a layer or layers. A LSTM component can be a type of artificial neural network (ANN) designed to recognize patterns in sequences of data, such as time series data. When provided with time series data, LSTMs take time and sequence into account such that an LSTM can include a temporal dimension. For example, consider utilization of one or more RNNs for processing temporal data from one or more sources, optionally in combination with spatial data. Such an approach may recognize temporal patterns, which may be utilized for making predictions (e.g., as to a pattern or patterns for future times, etc.).

As an example, the TENSORFLOW framework (Google LLC, Mountain View, California) may be implemented, which is an open-source software library for dataflow programming that includes a symbolic math library, which can be implemented for machine learning applications that can include neural networks. As an example, the CAFFE framework may be implemented, which is a DL framework developed by Berkeley AI Research (BAIR) (University of California, Berkeley, California). As another example, consider the SCIKIT platform (e.g., scikit-learn), which utilizes the PYTHON programming language. As an example, a framework such as the APOLLO AI framework may be utilized (APOLLO.AI GmbH, Germany). As mentioned, a framework such as the PYTORCH framework may be utilized.

As an example, a training method can include various actions that can operate on a dataset to train a ML model. As an example, a dataset can be split into training data and test data where test data can provide for evaluation. A method can include cross-validation of parameters and best parameters, which can be provided for model training.

The TENSORFLOW framework can run on multiple CPUs and GPUs (with optional CUDA (NVIDIA Corp., Santa Clara, California) and SYCL (The Khronos Group Inc., Beaverton, Oregon) extensions for general-purpose computing on graphics processing units (GPUs)). TENSORFLOW is available on 64-bit LINUX, MACOS (Apple Inc., Cupertino, California), WINDOWS (Microsoft Corp., Redmond, Washington), and mobile computing platforms including ANDROID (Google LLC, Mountain View, California) and IOS (Apple Inc.) operating system based platforms.

TENSORFLOW computations can be expressed as stateful dataflow graphs; noting that the name TENSORFLOW derives from the operations that such neural networks perform on multidimensional data arrays. Such arrays can be referred to as "tensors".

As an example, A method can include receiving input for a multiwell pad; selecting, based at least in part on a portion of the input, a template for the multiwell pad; generating, based at least in part on the template, well trajectories for the multiwell pad, where each of the well trajectories extends from a surface location of the multiwell pad to one or more reservoir target locations and where each of the well trajectories includes at least one curve generated using one or more dogleg severity values and one or more geometric control points that are not required to lie on one or more of the well trajectories; and outputting specifications for the generated trajectories of the multiwell pad. In such an example, the multiwell pad can include at least three well trajectories. As an example, such trajectories can be generated iteratively, optionally in a serial manner, where success of a trajectory can allow for generation of a neighboring trajectory where such an approach can be performed automatically to generate the trajectories for a multiwell pad.

As an example, at least one curve can be generated using a minimum curvature technique. As an example, at least one curve can be generated using a technique selected from a number of different techniques. In such an example, the technique may be automatically selected based at least in part on known positions of three control points. As an example, three control points can include an upper point at an upper depth and two lower points below the upper depth. As an example, a technique can be automatically selected based at least in part on known positions of two control points and one trajectory point. In such an example, the one trajectory point can be a start curve point and, for example, the two control points can include an upper control point at an upper depth and a lower control point at a lower depth.

As an example, a number of different techniques can include one or more single curve techniques and one or more multiple curve techniques.

As an example, one or more dogleg severity values can correspond to one or more bottom hole assemblies.

As an example, a method can include selecting a template by implementing a trained machine learning model. In such an example, a template may be selected and/or a number of candidate templates may be generated whereby a user may selected on of the candidate templates (e.g., optionally using a Pareto type of analysis, etc.).

As an example, a method can include generating that includes implementing an optimizer that optimizes well trajectories based on one or more drilling related physical parameters. For example, consider one or more drilling related physical parameters that can include one or more of torque and drag physical parameters and formation dogleg severity physical parameters. As an example, in a soft material (e.g., soft formation) it may be more difficult to drill a dogleg than in a hard material (e.g., a hard formation). As an example, a transition from one material to another material at a depth can be utilized as a basis for specifying one or more constraints, one or more control points, etc. For example, if a tighter curve is desired, then a kickoff point may be restricted to a particular depth that corresponds to a particular formation (rock formation), as may be evaluated and characterized relative to one or more other formations (e.g., rock formations).

As an example, generating can include implementing an evaluator that evaluates well trajectories based on one or more performance indicators.

As an example, generating can include implementing one or more anti-collision features that reduce risk of well trajectory collision during drilling of the well trajectories. As explained, a trajectory can include a nudge as a portion of the trajectory where a nudge can be utilized for anti-collision risk reduction. For a multiwell pad, nudges for trajectories can be coordinated such that drilling can occur for wells according to the trajectories without reduced risk of trajectory-to-trajectory collision. In such an example, nudges may be adjusted, optionally iteratively, until a final plan is generated for trajectories of the wells of the multiwell pad.

As an example, a method can include rendering a graphical user interface that includes a visualization of at least one of multiple well trajectories and a control point graphical control for adjusting a position of at least one of one or more control points. In such an example, a user may intervene in a method for trajectory generation for a multiwell pad. For example, consider a method that may indicate why a trajectory failed and provide one or more recommendations as to adjustments. In such an example, a GUI can be rendered with the one or more recommendations, which may allow a user to select and/or otherwise implement at least one of the one or more recommendations. For example, consider a recommendation to adjust a nudge parameter of one or more other wells such that a generation method can re-run for a number of the wells in an effort to arrive at a suitable set of trajectories with appropriate characteristics that meet constraints, which can include anti-collision related constraints.

As an example, a method can include receiving information for a multiwell pad where one or more wells may have been drilled or partially drilled. In such an example, known existing portions may be input and utilized for template selection and/or control point specification, determination, etc. In such an example, one or more trajectories can be generated for a portion or portions of a partially drilled well and/or a yet to be drilled well.

As an example, a method can include outputting specifications that include one or more performance indicators. For example, consider one or more collision related performance indicators, one or more drilling related performance indicators (e.g., HKLD, STOR, etc.), etc.

As an example, a system can include one or more processors; memory accessible to at least one of the one or more processors; processor-executable instructions stored in the memory and executable to instruct the system to: receive input for a multiwell pad; select, based at least in part on a portion of the input, a template for the multiwell pad; generate, based at least in part on the template, well trajectories for the multiwell pad, where each of the well trajectories extends from a surface location of the multiwell pad to one or more reservoir target locations and where each of the well trajectories includes at least one curve generated using one or more dogleg severity values and one or more geometric control points that are not required to lie on one or more of the well trajectories; and output specifications for the generated trajectories of the multiwell pad.

As an example, one or more computer-readable storage media can include processor-executable instructions to instruct a computing system to: receive input for a multiwell pad; select, based at least in part on a portion of the input, a template for the multiwell pad; generate, based at least in part on the template, well trajectories for the multiwell pad, where each of the well trajectories extends from a surface location of the multiwell pad to one or more reservoir target locations and wherein each of the well trajectories includes at least one curve generated using one or more dogleg severity values and one or more geometric control points that are not required to lie on one or more of the well trajectories; and output specifications for the generated trajectories of the multiwell pad.

As an example, a computer program product that can include computer-executable instructions to instruct a computing system to perform one or more methods such as one or more of the methods described herein (e.g., in part, in whole and/or in various combinations).

Figure 16:
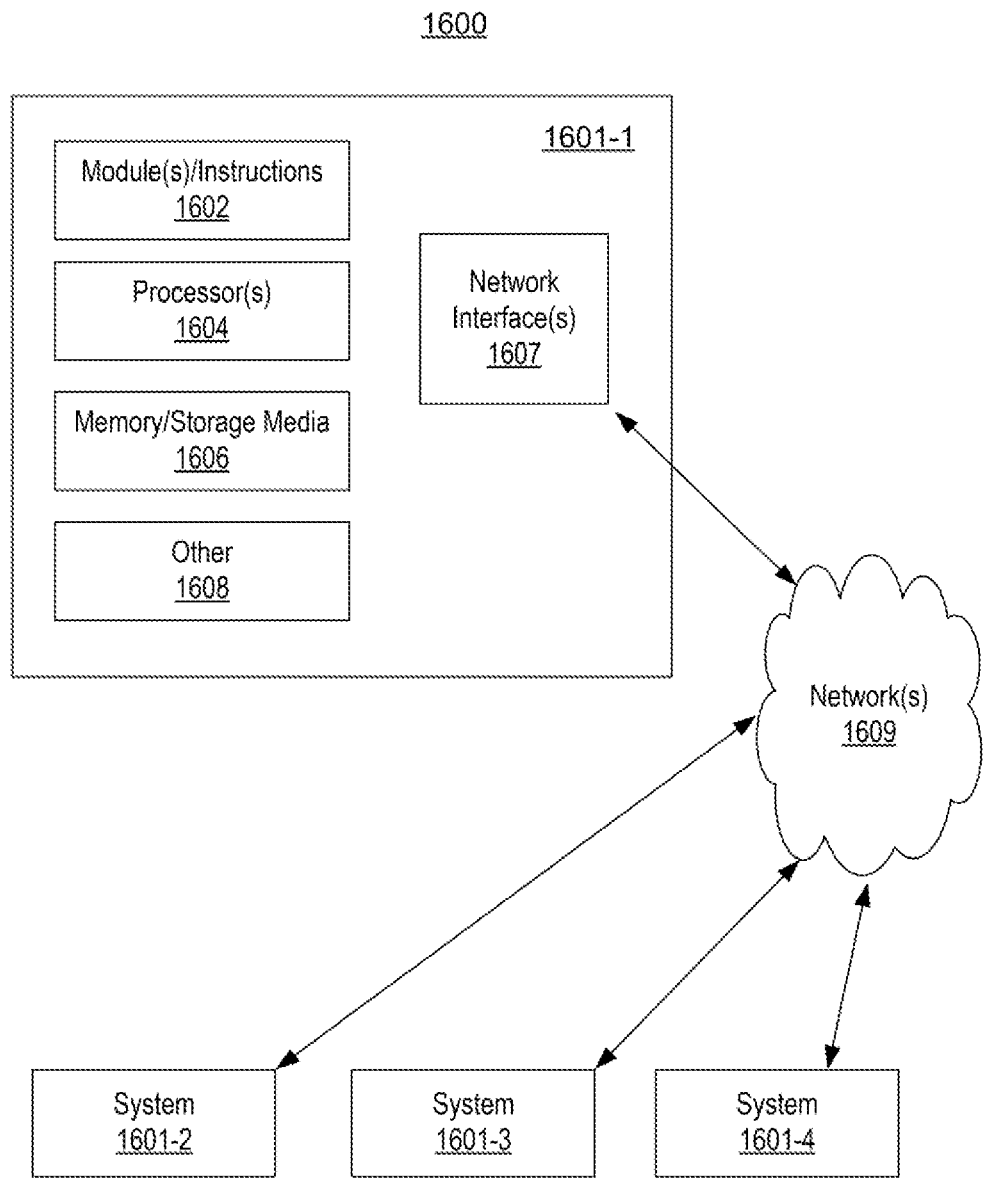
FIG. 16 shows an example of a system.

In some embodiments, a method or methods may be executed by a computing system. FIG. 16 shows an example of a system 1600 that can include one or more computing systems 1601-1, 1601-2, 1601-3 and 1601-4, which may be operatively coupled via one or more networks 1609, which may include wired and/or wireless networks.

As an example, a system can include an individual computer system or an arrangement of distributed computer systems. In the example of FIG. 16, the computer system 1601-1 can include one or more modules 1602, which may be or include processor-executable instructions, for example, executable to perform various tasks (e.g., receiving information, requesting information, processing information, simulation, outputting information, etc.).

As an example, a module may be executed independently, or in coordination with, one or more processors 1604, which is (or are) operatively coupled to one or more storage media 1606 (e.g., via wire, wirelessly, etc.). As an example, one or more of the one or more processors 1604 can be operatively coupled to at least one of one or more network interface 1607. In such an example, the computer system 1601-1 can transmit and/or receive information, for example, via the one or more networks 1609 (e.g., consider one or more of the Internet, a private network, a cellular network, a satellite network, etc.). As shown, one or more other components 1608 can be included in the computer system 1601-1.

As an example, the computer system 1601-1 may receive from and/or transmit information to one or more other devices, which may be or include, for example, one or more of the computer systems 1601-2, etc. A device may be located in a physical location that differs from that of the computer system 1601-1. As an example, a location may be, for example, a processing facility location, a data center location (e.g., server farm, etc.), a rig location, a wellsite location, a downhole location, etc.

As an example, a processor may be or include a microprocessor, microcontroller, processor module or subsystem, programmable integrated circuit, programmable gate array, or another control or computing device.

As an example, the storage media 1606 may be implemented as one or more computer-readable or machine-readable storage media. As an example, storage may be distributed within and/or across multiple internal and/or external enclosures of a computing system and/or additional computing systems.

As an example, a storage medium or storage media may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLUERAY disks, or other types of optical storage, or other types of storage devices.

As an example, a storage medium or media may be located in a machine running machine-readable instructions, or located at a remote site from which machine-readable instructions may be downloaded over a network for execution.

As an example, various components of a system such as, for example, a computer system, may be implemented in hardware, software, or a combination of both hardware and software (e.g., including firmware), including one or more signal processing and/or application specific integrated circuits.

As an example, a system may include a processing apparatus that may be or include a general purpose processors or application specific chips (e.g., or chipsets), such as ASICs, FPGAs, PLDs, or other appropriate devices.

As an example, a device may be a mobile device that includes one or more network interfaces for communication of information. For example, a mobile device may include a wireless network interface (e.g., operable via IEEE 802.11, ETSI GSM, BLUETOOTH, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few examples have been described in detail above, those skilled in the art will readily appreciate that many modifications are possible in the examples. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:
1. A method comprising:
receiving input for a multiwell pad;
selecting, based at least in part on a portion of the input, a template for the multiwell pad utilizing a trained machine learning model trained utilizing pad data, wherein the template comprises initial well trajectories associated with one or more anti-collision assurances or one or more anti-collision strategies;

generating, based at least in part on the template, well trajectories for the multiwell pad, wherein each of the well trajectories extends from a surface location of the multiwell pad to one or more reservoir target locations and wherein each of the well trajectories comprises at least one curve generated using one or more dogleg severity (DLS) values and a plurality of geometric control points that are not required to lie on one or more of the well trajectories, wherein the well trajectories are generated via a pad sketcher component configured to operate in a first operational mode and a second operational mode, the pad sketcher component comprising:

a preprocessor component configured to assign target points and one or more optimizations when the pad sketcher component operates in the first operational mode; and a generator component coupled to the preprocessor component and configured to utilize the target points and one or more optimizations to generate an output as specifications for the generated trajectories of the multiwell pad when the pad sketcher component operates in the first operational mode and generate the output as specifications for the generated trajectories of the multiwell pad via bypassing the preprocessor component when the pad sketcher component operates in the second operational mode; and outputting the specifications for the generated trajectories of the multiwell pad.

2. The method of claim 1, wherein the multiwell pad comprises at least three well trajectories.

3. The method of claim 1, wherein the at least one curve is generated using a minimum curvature technique.

4. The method of claim 1, wherein the at least one curve is generated using a technique selected from a number of different techniques.

5. The method of claim 4, wherein the technique is automatically selected based at least in part on known positions of three control points.

6. The method of claim 5, wherein the three control points comprise an upper point at an upper depth and two lower points below the upper depth.

7. The method of claim 4, wherein the technique is automatically selected based at least in part on known positions of two control points and one trajectory point.

8. The method of claim 7, wherein the one trajectory point is a start curve point and the two control points comprise an upper control point at an upper depth and a lower control point at a lower depth.

9. The method of claim 4, wherein the number of different techniques comprises one or more single curve techniques and one or more multiple curve techniques.

10. The method of claim 1, wherein the one or more DLS values correspond to one or more bottom hole assemblies.

11. The method of claim 1, wherein the selecting the template comprises implementing a trained machine learning model, and wherein the generating comprises implementing an optimizer that optimizes the well trajectories based on one or more drilling related physical parameters.

12. The method of claim 11, wherein the one or more drilling related physical parameters comprise one or more of torque and drag physical parameters and formation DLS physical parameters.

13. The method of claim 1, wherein the generating comprises implementing an evaluator that evaluates the well trajectories based on one or more performance indicators or implementing one or more anti-collision features as the one or more anti-collision assurances or one or more anti-collision strategies that reduce risk of well trajectory collision during drilling of the well trajectories.

14. The method of claim 1, comprising rendering a graphical user interface that comprises a visualization of at least one of the well trajectories and a control point graphical control for adjusting a position of at least one geometric control point of the plurality of geometric control points.

15. The method of claim 1, wherein the specifications comprise one or more performance indicators.

16. The method of claim 1, wherein the one or more DLS values include at least one of a nudge build DLS value indicative of a first amount of alteration of the at least one curve in a build direction, a nudge drop DLS value indicative of a second amount of alteration of the at least one curve in a drop direction, and a build DLS value indicative of an amount of rapid change of the at least one curve in the drop direction.

17. A system comprising:
one or more processors;
memory accessible to at least one of the one or more processors;
processor-executable instructions stored in the memory and executable to instruct the system to:
receive input for a multiwell pad;
select, based at least in part on a portion of the input, a template for the multiwell pad utilizing a trained machine learning model trained utilizing pad data, wherein the template comprises initial well trajectories associated with one or more anti-collision assurances or one or more anti-collision strategies;
generate, based at least in part on the template, well trajectories for the multiwell pad, wherein each of the well trajectories extends from a surface location of the multiwell pad to one or more reservoir target locations and wherein each of the well trajectories comprises at least one curve generated using one or more dogleg severity (DLS) values and a plurality of geometric control points that are not required to lie on one or more of the well trajectories, wherein the well trajectories are generated via a pad sketcher component configured to operate in a first operational mode and a second operational mode, the pad sketcher component comprising:

a preprocessor component configured to assign target points and one or more optimizations when the pad sketcher component operates in the first operational mode; and a generator component coupled to the preprocessor component and configured to utilize the target points and one or more optimizations to generate an output as specifications for the generated trajectories of the multiwell pad when the pad sketcher component operates in the first operational mode and generate the output as specifications for the generated trajectories of the multiwell pad via bypassing the preprocessor component when the pad sketcher component operates in the second operational mode; and output the specifications for the generated well trajectories of the multiwell pad.

18. The system of claim 17, wherein the one or more DLS values include at least one of a nudge build DLS value indicative of a first amount of alteration of the at least one curve in a build direction, a nudge drop DLS value indicative of a second amount of alteration of the at least one curve in a drop direction, and a build DLS value indicative of an amount of rapid change of the at least one curve in the drop direction.

19. One or more computer-readable storage media comprising processor-executable instructions to instruct a computing system to:
receive input for a multiwell pad;
select, based at least in part on a portion of the input, a template for the multiwell pad utilizing a trained machine learning model trained utilizing pad data, wherein the template comprises initial well trajectories associated with one or more anti-collision assurances or one or more anti-collision strategies;
generate, based at least in part on the template, well trajectories for the multiwell pad, wherein each of the well trajectories extends from a surface location of the multiwell pad to one or more reservoir target locations and wherein each of the well trajectories comprises at least one curve generated using one or more dogleg severity (DLS) values and a plurality of geometric control points that are not required to lie on one or more of the well trajectories, wherein the well trajectories are generated via a pad sketcher component configured to operate in a first operational mode and a second operational mode, the pad sketcher component comprising:
a preprocessor component configured to assign target points and one or more optimizations when the pad sketcher component operates in the first operational mode; and
a generator component coupled to the preprocessor component and configured to utilize the target points and one or more optimizations to generate an output as specifications for the generated trajectories of the multiwell pad when the pad sketcher component operates in the first operational mode and generate the output as specifications for the generated trajectories of the multiwell pad via bypassing the preprocessor component when the pad sketcher component operates in the second operational mode; and
output the specifications for the generated trajectories of the multiwell pad.

20. The one or more computer-readable storage media comprising processor-executable instructions to instruct a computing system of claim 19, wherein the one or more DLS values include at least one of a nudge build DLS value indicative of a first amount of alteration of the at least one curve in a build direction, a nudge drop DLS value indicative of a second amount of alteration of the at least one curve in a drop direction, and a build DLS value indicative of an amount of rapid change of the at least one curve in the drop direction.

\* \* \* \* \*